(12) United States Patent
Fuji et al.

(10) Patent No.: US 10,883,815 B2
(45) Date of Patent: Jan. 5, 2021

(54) FILM STRAIN SENSOR CONFIGURATION INCLUDING A PROCESSOR

(71) Applicant: KABUSHIKI KAISHA TOSHIBA, Tokyo (JP)

(72) Inventors: Yoshihiko Fuji, Kanagawa (JP); Yoshihiro Higashi, Ishikawa (JP); Michiko Hara, Kanagawa (JP); Kazuaki Okamoto, Kanagawa (JP); Shotaro Baba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 16/281,192

(22) Filed: Feb. 21, 2019

(65) Prior Publication Data
US 2020/0049483 A1 Feb. 13, 2020

(30) Foreign Application Priority Data

Aug. 13, 2018 (JP) ................................ 2018-152395

(51) Int. Cl.
*G01B 7/14* (2006.01)
*G01B 7/24* (2006.01)
(Continued)

(52) U.S. Cl.
CPC ................ *G01B 7/24* (2013.01); *G01L 1/125* (2013.01); *H01F 1/0009* (2013.01); *H01L 41/125* (2013.01)

(58) Field of Classification Search
None
See application file for complete search history.

(56) References Cited

U.S. PATENT DOCUMENTS 4,920,806 A * 5/1990 Obama ..................... G01B 7/24
324/209
7,074,641 B2 * 7/2006 Kondo ................... C30B 25/105
257/E21.101
(Continued)

FOREIGN PATENT DOCUMENTS

JP 2011-244938 A 12/2011
JP 2015-59925 A 3/2015
(Continued)

OTHER PUBLICATIONS

Barraud et al., "Magnetoresistance in magnetic tunnel junctions grown on flexible organic substrates," Applied Physics Letters, 96:072502-1 to 072502-3 (2010).
(Continued)

*Primary Examiner* — Natalie Huls
*Assistant Examiner* — Jermaine L Jenkins
(74) *Attorney, Agent, or Firm* — Finnegan, Henderson, Farabow, Garrett & Dunner, L.L.P.

(57) ABSTRACT

According to one embodiment, a sensor includes a film portion, one or more detectors fixed to the film portion, and a processor. The detector includes first and second detecting elements. The first detecting element includes a first magnetic layer. The second detecting element includes a second magnetic layer. A first change rate of a first signal is higher than a second change rate of the first signal. The first signal corresponds to a first electrical resistance of the first detecting element. A change rate of a second signal with respect to the change of the magnitude of the strain is higher than the second change rate. The second signal corresponds to a second electrical resistance of the second detecting element. The processor is configured to perform at least a first operation of outputting a second value. The second value is based on the second signal and a first value.

20 Claims, 11 Drawing Sheets

(51) Int. Cl.
*G01L 1/12* (2006.01)
*H01F 1/00* (2006.01)
*H01L 41/12* (2006.01)

(56) References Cited

U.S. PATENT DOCUMENTS

| | | | | |
|---|---|---|---|---|
| 9,581,505 | B2* | 2/2017 | Inoue | G01L 1/125 |
| 9,818,928 | B2* | 11/2017 | Park | H01L 41/0825 |
| 10,060,818 | B2* | 8/2018 | Yuzawa | H01L 41/00 |
| 10,379,574 | B2* | 8/2019 | Kim | H01L 51/107 |
| 10,649,588 | B2* | 5/2020 | Amin | H01L 41/1132 |
| 2011/0295128 | A1 | 12/2011 | Yuasa et al. | |
| 2012/0242592 | A1* | 9/2012 | Rothkopf | G06F 3/0412 |
| | | | | 345/173 |
| 2014/0369530 | A1* | 12/2014 | Fuji | G01L 1/12 |
| | | | | 381/122 |
| 2015/0082886 | A1 | 3/2015 | Fukuzawa et al. | |
| 2015/0271586 | A1 | 9/2015 | Fukuzawa et al. | |
| 2017/0067791 | A1 | 3/2017 | Fuji et al. | |
| 2018/0080953 | A1 | 3/2018 | Fuji et al. | |

FOREIGN PATENT DOCUMENTS

| | | |
|---|---|---|
| JP | 2015-184067 A | 10/2015 |
| JP | 2017-40509 A | 2/2017 |
| JP | 2017-49202 A | 3/2017 |
| JP | 2018-48897 A | 3/2018 |

OTHER PUBLICATIONS

Ota et al., "A flexible giant magnetoresistive device for sensing strain direction," Nature Electronics, 1:124-129 (Feb. 2018).

* cited by examiner

FILM STRAIN SENSOR CONFIGURATION INCLUDING A PROCESSOR

CROSS-REFERENCE TO RELATED APPLICATIONS

This application is based upon and claims the benefit of priority from Japanese Patent Application No. 2018-152395, filed on Aug. 13, 2018; the entire contents of which are incorporated herein by reference.

FIELD

Embodiments described herein relate generally to a sensor.

BACKGROUND

For example, there is a sensor that uses a magnetic layer. For example, strain is detected by the sensor.

DETAILED DESCRIPTION

Figure 1A:
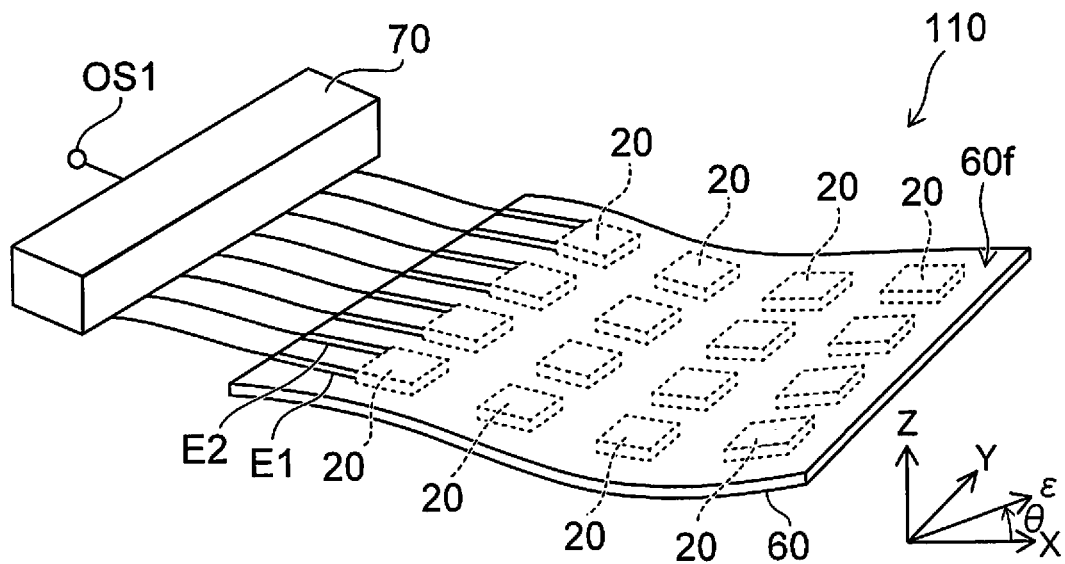
FIG. 1A to FIG. 1D are schematic views illustrating a sensor according to a first embodiment.

According to one embodiment, a sensor includes a film portion, one or more detectors fixed to the film portion, and a processor. A magnitude of a strain of the film portion includes a first range, and a second range larger than the first range. The detector includes a first detecting element and a second detecting element. The first detecting element includes a first magnetic layer. The second detecting element includes a second magnetic layer. A first change rate of a first signal is higher than a second change rate of the first signal. The first signal corresponds to a first electrical resistance of the first detecting element. The first change rate is a change rate of the first signal with respect to a change of the magnitude of the strain within the first range. The second change rate is a change rate of the first signal with respect to a change of the magnitude of the strain within the second range. A change rate of a second signal with respect to the change of the magnitude of the strain within the second range is higher than the second change rate. The second signal corresponds to a second electrical resistance of the second detecting element. The processor is configured to perform at least a first operation of outputting a second value. The second value is based on the second signal and a first value. The first value is based on the first signal when a first strain is generated in the film portion. The second signal is when the first strain is generated in the film portion.

According to another embodiment, a sensor includes a film portion, and one or more detectors fixed to the film portion. The detector includes first to fourth detecting elements. The first detecting element includes a first magnetic layer, a first opposing magnetic layer, and a first nonmagnetic layer provided between the first magnetic layer and the first opposing magnetic layer. The second detecting element includes a second magnetic layer, a second opposing magnetic layer, and a second nonmagnetic layer provided between the second magnetic layer and the second opposing magnetic layer. The third detecting element includes a third magnetic layer, a third opposing magnetic layer, and a third nonmagnetic layer provided between the third magnetic layer and the third opposing magnetic layer. The fourth detecting element includes a fourth magnetic layer, a fourth opposing magnetic layer, and a fourth nonmagnetic layer provided between the fourth magnetic layer and the fourth opposing magnetic layer. A magnetization of the first opposing magnetic layer is aligned with a magnetization of the second opposing magnetic layer. A magnetization of the third opposing magnetic layer is aligned with a magnetization of the fourth opposing magnetic layer. The magnetization of the third opposing magnetic layer crosses the magnetization of the first opposing magnetic layer. A magnitude of a strain of the film portion includes a first range, and a second range larger than the first range. A first change rate of a first signal is higher than a second change rate of the first signal. The first signal corresponds to a first electrical resistance of the first detecting element. The first change rate is a change rate of the first signal with respect to a change of the magnitude of the strain within the first range. The second change rate is a change rate of the first signal with respect to a change of the magnitude of the strain within the second range. A change rate of a second signal with respect to the change of the magnitude of the strain within the second range is higher than the second change rate. The second signal corresponds to a second electrical resistance of the second detecting element. A third change rate of a third signal is higher than a fourth change rate of the third signal. The third signal corresponds to a third electrical resistance of the third detecting element. The third change rate is a change rate of the third signal with respect to the change of the strain within the first range. The fourth change rate is a change rate of the third signal with respect to the change of the strain within the second range. A change rate of a fourth signal with respect to the change of the strain within the second range is higher than the fourth change rate. The fourth signal corresponds to a fourth electrical resistance of the fourth detecting element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1D are schematic views illustrating a sensor according to a first embodiment.

Figure 1B:
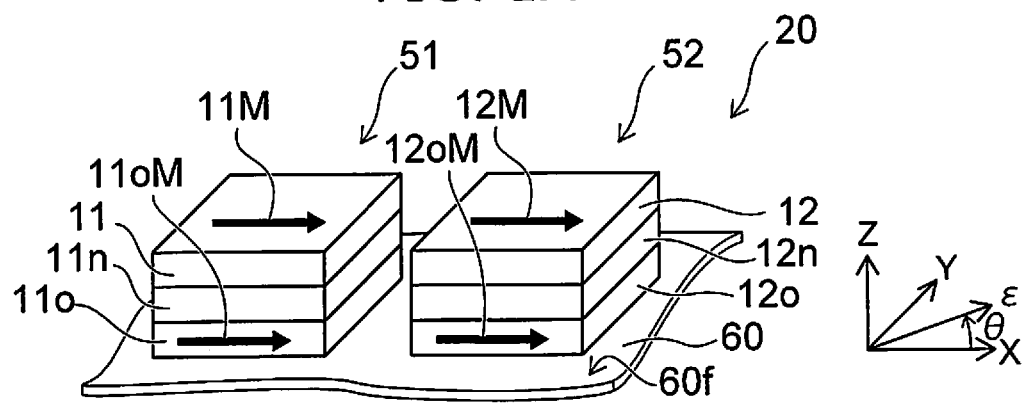
Figures 1C, 1D:
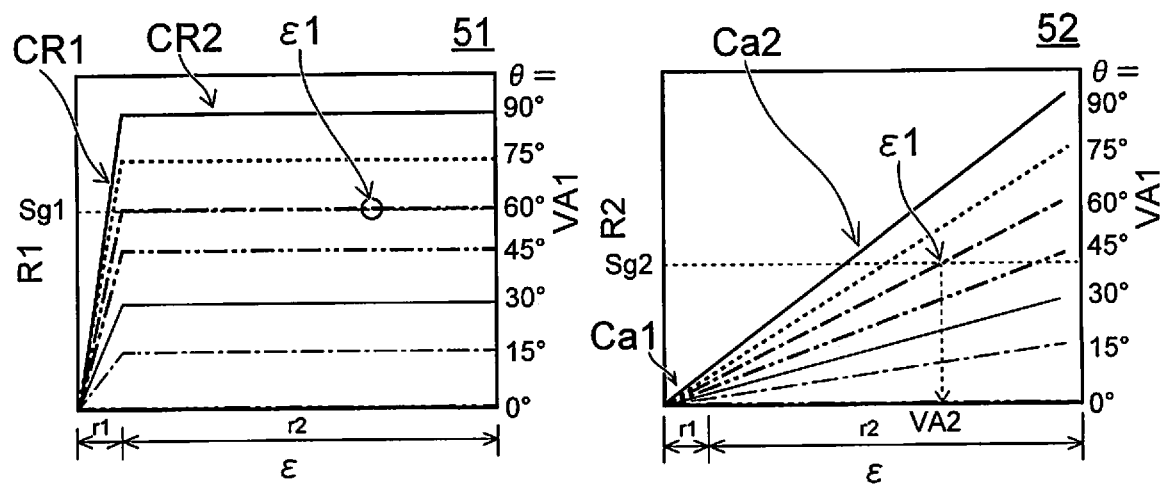

FIG. 1A is a perspective view. FIG. 1B is a perspective view illustrating a portion of FIG. 1A. FIG. 1C and FIG. 1D are graphs illustrating characteristics of the sensor.

As shown in FIG. 1A, the sensor 110 according to the embodiment includes a film portion 60 and a detector 20. The detector 20 is fixed to the film portion 60. The number of the detectors 20 is one or more. In the example, the multiple detectors 20 are provided at a first surface 60f of the film portion 60.

A processor 70 is provided in the example. The processor 70 is electrically connected to at least one of the multiple detectors 20. For example, the detector 20 and the processor 70 are electrically connected by a first conductive portion E1 and a second conductive portion E2. The first conductive portion E1 and the second conductive portion E2 are, for example, interconnects. The first conductive portion E1 and the second conductive portion E2 are, for example, electrodes. The first conductive portion E1 and the second conductive portion E2 are, for example, terminals. The processor 70 includes, for example, a processing circuit.

The film portion 60 is deformable. The film portion 60 deforms when a force is applied to the film portion 60. Strain is generated in the film portion 60. The strain of the film portion 60 is the detection object of the sensor 110.

FIG. 1B illustrates one of the multiple detectors 20. The one of the multiple detectors 20 includes a first detecting element 51 and a second detecting element 52.

As shown in FIG. 1B, the first detecting element 51 includes a first magnetic layer 11. In the example, the first detecting element 51 further includes a first opposing magnetic layer 11o and a first nonmagnetic layer 11n. The first nonmagnetic layer 11n is provided between the first magnetic layer 11 and the first opposing magnetic layer 11o.

The second detecting element 52 includes a second magnetic layer 12. In the example, the second detecting element 52 further includes a second opposing magnetic layer 12o and a second nonmagnetic layer 12n. The second nonmagnetic layer 12n is provided between the second magnetic layer 12 and the second opposing magnetic layer 12o.

The electrical resistances of these detecting elements change when strain is generated in the film portion 60. For example, strain is generated in the magnetic layers included in the detecting elements according to the strain of the film portion 60. The orientations of the magnetizations of the magnetic layers change when the strain is generated in the magnetic layers. For example, the changes of the orientations of the magnetizations are based on an inverse magnetostrictive effect (e.g., the Villari effect). In the case where multiple magnetic layers are included in a detecting element, the angle of the orientations of the magnetizations of the multiple magnetic layers changes according to the strain. The electrical resistance of the detecting element changes based on the change of the angle of the orientations of the magnetizations. For example, the change of the electrical resistance is based on a magnetoresistance effect. The detecting element may include, for example, a TMR element or a GMR element.

For example, the orientation of a magnetization 11M of the first magnetic layer 11 changes easily compared to the orientation of a magnetization 11oM of the first opposing magnetic layer 11o. A magnetization 12M of the second magnetic layer 12 changes easily compared to a magnetization 12oM of the second opposing magnetic layer 12o. For example, the first magnetic layer 11 and the second magnetic layer 12 may function as free magnetic layers. For example, the first opposing magnetic layer 11o and the second opposing magnetic layer 12o may function as reference layers.

In the example, the magnetization 11oM of the first opposing magnetic layer 11o is aligned with the magnetization 12oM of the second opposing magnetic layer 12o. For example, the angle between the magnetization 12oM and the magnetization 11oM is greater than −45 degrees but less than 45 degrees. Or, this angle is greater than 135 degrees but less than 225 degrees. In the example, the magnetization 11oM and the magnetization 12oM are substantially parallel to an X-axis direction.

In the embodiment, the direction from the film portion 60 toward the first magnetic layer 11 is called the "stacking direction" for convenience. The stacking direction is taken as a Z-axis direction. One direction perpendicular to the Z-axis direction is taken as the X-axis direction. A direction perpendicular to the Z-axis direction and the X-axis direction is taken as a Y-axis direction. For example, the stacking direction crosses the first surface 60f of the film portion 60. In one example, the stacking direction is perpendicular to the first surface 60f.

In the embodiment, one of the first magnetic layer 11 or the first opposing magnetic layer 11o is provided between the first surface 60f and the other of the first magnetic layer 11 or the first opposing magnetic layer 11o in the stacking direction (the Z-axis direction). In the example, the first opposing magnetic layer 11o is provided between the first magnetic layer 11 and the first surface 60f.

In the embodiment, one of the second magnetic layer 12 or the second opposing magnetic layer 12o is provided between the first surface 60f and the other of the second magnetic layer 12 or the second opposing magnetic layer 120 in the stacking direction. In the example, the second opposing magnetic layer 12o is provided between the second magnetic layer 12 and the first surface 60f.

An example of the characteristics of these detecting elements will now be described.

FIG. 1C illustrates a characteristic of the first detecting element 51. FIG. 1D illustrates a characteristic of the second detecting element 52. In these figures, the horizontal axis corresponds to the magnitude of a strain ε of the film portion 60. The vertical axis of FIG. 1C corresponds to a first electrical resistance R1 of the first detecting element 51. The first electrical resistance R1 may be the first electrical resistance R1, a voltage corresponding to the first electrical resistance R1, or a current corresponding to the first electrical resistance R1. The vertical axis of FIG. 1D corresponds to a second electrical resistance R2 of the second detecting element 52. The second electrical resistance R2 may be the second electrical resistance R2, a voltage corresponding to the second electrical resistance R2, or a current corresponding to the second electrical resistance R2.

The characteristics are shown in FIG. 1C and FIG. 1D for angles θ of the direction of the strain ε generated in the film portion 60 of 0 degrees to 90 degrees. The angle θ is the angle between the X-axis direction and the direction of the strain ε.

As shown in FIG. 1C, a first signal Sg1 (e.g., the first electrical resistance R1) changes with high sensitivity when the strain ε is small. The first signal Sg1 (e.g., the first electrical resistance R1) is saturated and substantially does not change when the strain ε is large.

As shown in FIG. 1D, a second signal Sg2 (e.g., the second electrical resistance R2) changes when the strain ε is small and large.

For example, as shown in these figures, the magnitude of the strain ε of the film portion 60 includes a first range r1 and a second range r2. The second range r2 is larger than the first range r1.

The change rate of the first signal Sg1 with respect to the change of the magnitude of the strains within the first range r1 (referring to FIG. 1C) is taken as a first change rate CR1 of the first signal Sg1. The change rate of the first signal Sg1 with respect to the change of the magnitude of the strain ε within the second range r2 (referring to FIG. 1C) is taken as a second change rate CR2 of the first signal Sg1. The first change rate CR1 is higher than the second change rate CR2. In the example, the second change rate CR2 is substantially 0.

As shown in FIG. 1D, a change rate Ca2 of the second signal Sg2 with respect to the change of the magnitude of the strain ε within the second range r2 is higher than the second change rate CR2 recited above (in the example, substantially 0). In the example, the change rate Ca2 of the second signal Sg2 with respect to the change of the strain ε within the first range r1 is lower than the first change rate CR1 in the embodiment (referring to FIG. 1C). For example, the change rate of the second signal Sg2 (a change rate Ca1 and the change rate Ca2) is higher than the second change rate CR2 and lower than the first change rate CR1 of the first detecting element 51.

As shown in FIG. 1C, the first signal Sg1 saturates at a small strain ε. The saturated value of the first signal Sg1 corresponds to the direction (the angle θ) of the strain ε. Accordingly, the direction (the angle θ) of the strain ε can be known from the saturated value of the first signal Sg1.

On the other hand, as shown in FIG. 1D, if the direction (the angle θ) of the strain is known, the magnitude of the strain ε can be known from the value of the second signal Sg2.

In the embodiment, for example, the information relating to the strain can be obtained from the first signal Sg1 and the second signal Sg2. This strain is the detection object of the sensor 110 (e.g., a first strain).

For example, the processor 70 is configured to perform at least the following first operation. In the first operation, the processor 70 outputs a second value VA2 (referring to FIG. 1D). A first value VA1 (referring to FIG. 1C) also may be output in the first operation. The first value VA1 is based on the first signal Sg1 (referring to FIG. 1C) when the first strain ε1 is generated in the film portion 60. The second value VA2 is based on the second signal Sg2 and the first value VA1 when the first strain ε1 is generated in the film portion 60. For example, the values recited above are output from an outputter OS1 of the processor 70.

As shown in FIG. 1C and FIG. 1D, the first strain ε1 is within the second range r2. As shown in FIG. 1C, when the strain ε is within the second range r2, the first signal Sg1 is substantially independent of the magnitude of the strain ε, and is dependent on the direction (the angle θ) of the strain ε. Information relating to the direction (the angle θ) of the first strain ε1 can be obtained from the value of the first signal Sg1. The information corresponds to the first value VA1. The first value VA1 corresponds to the direction (the angle θ) of the first strain ε1, and is 60 degrees in the example of FIG. 1C.

As shown in FIG. 1D, the second value VA2 is obtained from the value of the second signal Sg2 when the direction (the angle θ) of the first strain ε1 is 60 degrees.

Thus, the first value VA1 includes the information relating to the direction (the angle θ) of the first strain ε1. The second value VA2 includes the information relating to the magnitude of the first strain ε1.

For example, there is a first reference example in which only the first detecting element 51 is used. In such a case, the first signal substantially does not change with respect to the magnitude of the strain ε in the second range r2. Therefore, it is difficult to detect the magnitude of the strain ε with high sensitivity in the first reference example.

On the other hand, there is a second reference example in which only the second detecting element 52 is used. In such a case, the second signal changes with respect to the magnitude of the strain ε in the second range r2. However, as shown in FIG. 1D, the second signal Sg2 is dependent on the direction (the angle θ) of the strain ε in addition to the magnitude of the strain ε. Therefore, it is difficult to detect the strain ε with high sensitivity in the second reference example as well.

Conversely, in the embodiment, the direction (the angle θ) and the magnitude of the first strain ε1 which is the detection object can be detected by providing the two types of detecting elements. According to the embodiment, a sensor that has higher sensitivity can be provided.

In the example recited above, the angle θ is 0 degrees to 90 degrees. The description recited above also is applicable in the case where the angle θ is 90 degrees to 180 degrees, 180 degrees to 270 degrees, or 270 degrees to 360 degrees.

Figure 2:
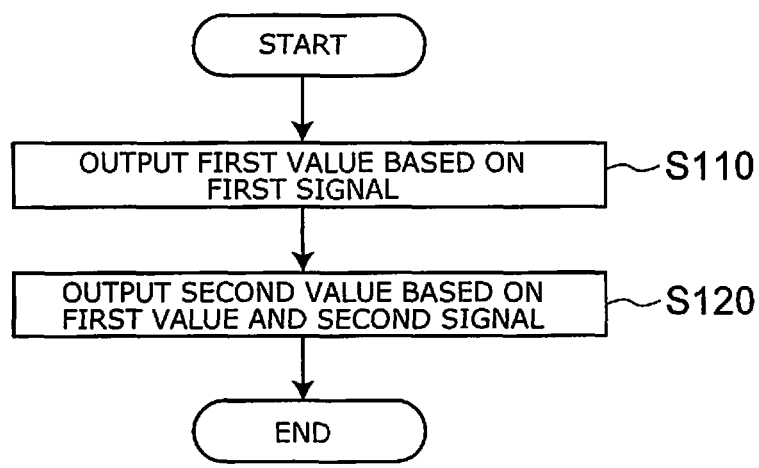
FIG. 2 is a flowchart illustrating the operation of the sensor according to the first embodiment.

FIG. 2 is a flowchart illustrating the operation of the sensor according to the first embodiment.

As shown in FIG. 2, the first value VA1 that is based on the first signal Sg1 is output (step S110). The first signal Sg1 corresponds to the first electrical resistance R1 when the first strain ε1 is generated in the film portion 60. The second value VA2 that is based on the first value VA1 and the second signal Sg2 is output (step S120). For example, at least the first operation including steps S110 and S120 recited above is performed. For example, such an operation may be performed by the processor 70.

In the embodiment, the second change rate CR2 may be substantially 0. For example, the first change rate CR1 may be 5 times the second change rate CR2 or more. For example, the first change rate CR1 may be 10 times the second change rate CR2 or more.

For example, the first electrical resistance R1 corresponds to the electrical resistance between the first magnetic layer 11 and the first opposing magnetic layer 11o. For example, the second electrical resistance R2 corresponds to the electrical resistance between the second magnetic layer 12 and the second opposing magnetic layer 12o.

Second Embodiment

FIG. 3A to FIG. 3E are schematic views illustrating a sensor according to a second embodiment.

Figure 3A:
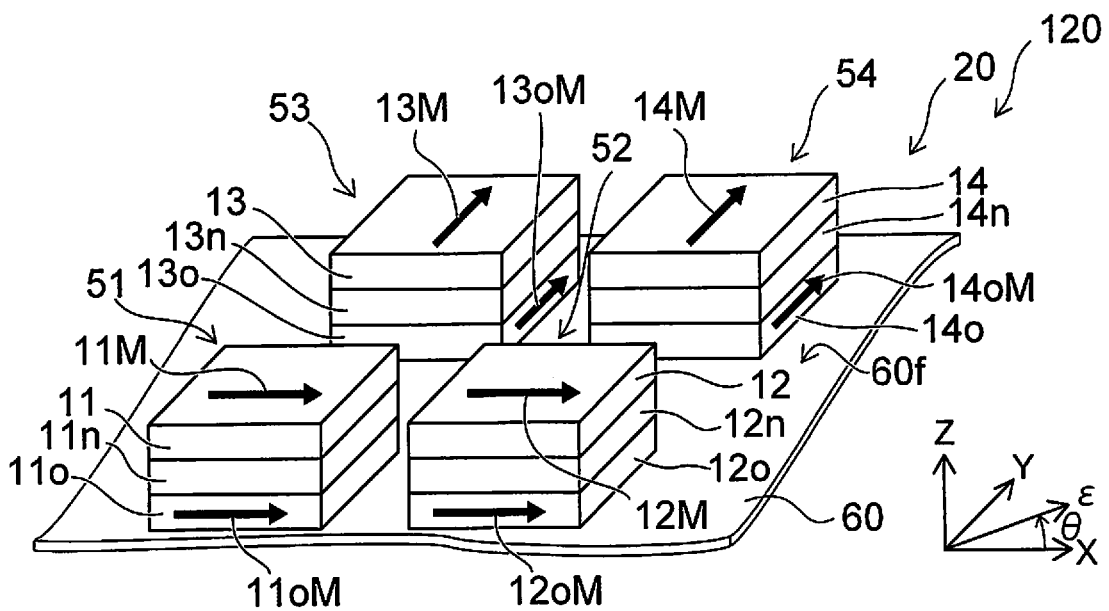
FIG. 3A to FIG. 3E are schematic views illustrating a sensor according to a second embodiment.

FIG. 3A is a perspective view illustrating a portion of the sensor. FIG. 3B to FIG. 3E are graphs illustrating characteristics of the sensor.

As shown in FIG. 3A, the sensor 120 according to the embodiment includes the film portion 60 and the detector 20. The sensor 120 may further include the processor 70 (referring to FIG. 1A).

In the sensor 120 as well, the detector 20 is fixed to the film portion 60. Multiple detectors 20 may be provided at the first surface 60f of the film portion 60 (referring to FIG. 1A).

The detector 20 further includes a third detecting element 53 and a fourth detecting element 54 in addition to the first detecting element 51 and the second detecting element 52. The configurations of the first detecting element 51 and the second detecting element 52 of the sensor 120 may be similar to the configurations of the first detecting element 51 and the second detecting element 52 of the sensor 110. Examples of the third detecting element 53 and the fourth detecting element 54 will now be described.

As shown in FIG. 3A, the third detecting element 53 includes, for example, a third magnetic layer 13, a third opposing magnetic layer 13o, and a third nonmagnetic layer 13n provided between the third magnetic layer 13 and the third opposing magnetic layer 13o.

As shown in FIG. 3A, the fourth detecting element 54 includes, for example, a fourth magnetic layer 14, a fourth opposing magnetic layer 14o, and a fourth nonmagnetic layer 14n provided between the fourth magnetic layer 14 and the fourth opposing magnetic layer 14o.

For example, one of the third magnetic layer 13 or the third opposing magnetic layer 13o is provided between the first surface 60f and the other of the third magnetic layer 13 or the third opposing magnetic layer 13o in the stacking direction (the Z-axis direction). In the example, the third opposing magnetic layer 13o is provided between the third magnetic layer 13 and the first surface 60f.

For example, in one direction, one of the fourth magnetic layer 14 or the fourth opposing magnetic layer 14o is provided between the first surface 60f and the other of the fourth magnetic layer 14 or the fourth opposing magnetic layer 14o. In the example, the fourth opposing magnetic layer 14o is provided between the fourth magnetic layer 14 and the first surface 60f.

In the embodiment, a magnetization 13oM of the third opposing magnetic layer 13o is aligned with a magnetization 14oM of the fourth opposing magnetic layer 14o. For example, the magnetization 13oM may be substantially parallel to the magnetization 14oM.

The magnetization 13oM of the third opposing magnetic layer 13o crosses the magnetization 11oM of the first opposing magnetic layer 11o. For example, the magnetization 14oM of the fourth opposing magnetic layer 14o crosses the magnetization 12oM of the second opposing magnetic layer 12o.

Figure 3B:
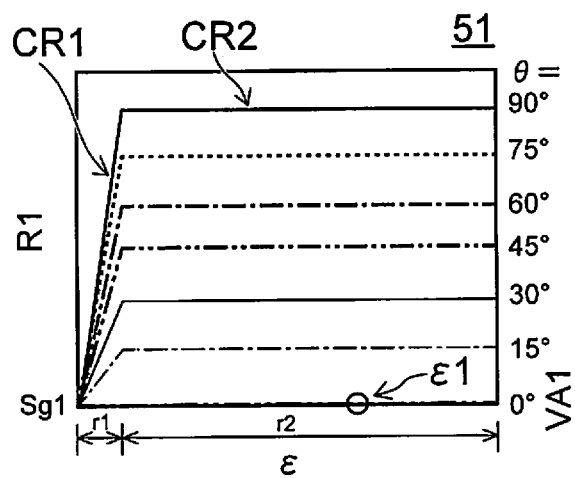
Figure 3C:
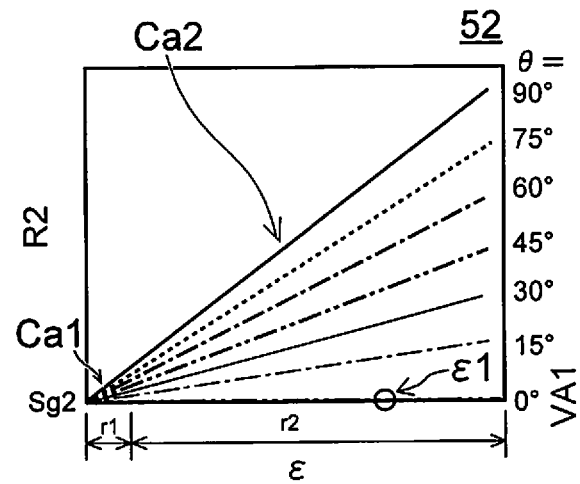

FIG. 3B to FIG. 3E illustrate the characteristics of the first to fourth detecting elements 51 to 54. In these figures, the horizontal axis corresponds to the magnitude of the strain s of the film portion 60. In the sensor 120 as well, the magnitude of the strain ε of the film portion 60 includes the first range r1 and the second range r2. The second range r2 is larger than the first range r1. In FIG. 3B to FIG. 3E, the vertical axis corresponds to the first to fourth electrical resistances R1 to R4 corresponding respectively to the first to fourth detecting elements 51 to 54. As shown in FIG. 3B and FIG. 3C, the characteristics of the first electrical resistance R1 and the second electrical resistance R2 of the sensor 120 are similar to the characteristics of the first electrical resistance R1 and the second electrical resistance R2 of the sensor 110.

Figure 3D:
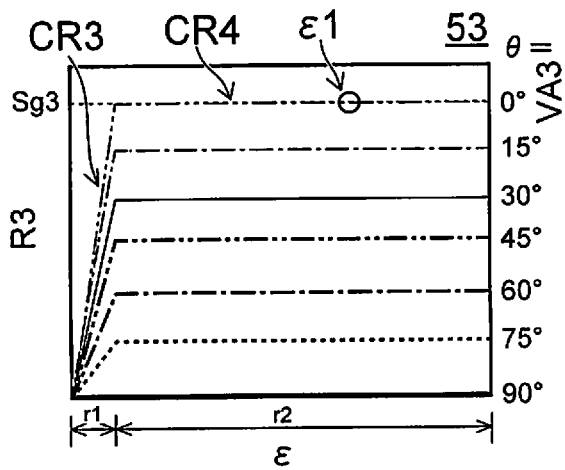
Figure 3E:
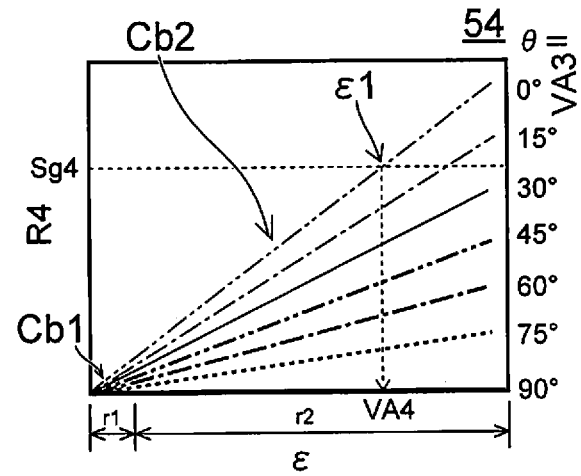

A third change rate CR3 of a third signal Sg3 corresponding to a third electrical resistance R3 of the third detecting element 53 (referring to FIG. 3D) is higher than a fourth change rate CR4 of the third signal Sg3 (referring to FIG. 3D). The third change rate CR3 is the change rate of the third signal Sg3 with respect to the change of the strain ε within the first range r1. The fourth change rate CR4 is the change rate of the third signal Sg3 with respect to the change of the strain ε within the second range r2.

A change rate Cb2 of a fourth signal Sg4 corresponding to the fourth electrical resistance R4 of the fourth detecting element 54 with respect to the change of the strain ε within the second range r2 (FIG. 3E) is higher than the fourth change rate CR4 recited above (referring to FIG. 3D).

The processor 70 may further perform at least the following second operation. In the second operation, the processor 70 outputs a fourth value VA4 (referring to FIG. 3E). In the second operation, the processor 70 may further output a third value VA3 (referring to FIG. 3D). The third value VA3 is based on the third signal Sg3 when the first strain ε1 is generated in the film portion 60 (referring to FIG. 3D). The fourth value VA4 is based on the third value VA3 recited above and the fourth signal Sg4 when the first strain ε1 is generated in the film portion 60 (referring to FIG. 3E).

As shown in FIG. 3B, the first signal Sg1 substantially does not change when the direction (the angle θ) of the first strain ε1 is aligned with the direction of the magnetization of the magnetic layer of the first detecting element 51. At this time, as shown in FIG. 3D, the direction (the angle θ) of the first strain ε1 crosses the direction of the magnetization of the magnetic layer of the third detecting element 53. Therefore, the third signal Sg3 changes according to the first strain ε1. Accordingly, the first strain ε1 can be detected by the third detecting element 53 even when it is difficult for the first detecting element 51 to detect the first strain ε1. Similarly, the second signal Sg2 substantially does not change when the direction (the angle θ) of the first strain ε1 is aligned with the direction of the magnetization of the magnetic layer of the second detecting element 52. At this time, the first strain ε1 can be detected by the fourth detecting element 54.

For example, the third value VA3 includes the information relating to the direction (the angle θ) of the first strain ε1. In the example shown in FIG. 3D, the third value VA3 corresponds to an angle θ of 0 degrees. The fourth value VA4 includes the information relating to the magnitude of the first strain ε1.

In the sensor 120, the direction (the angle θ) and the magnitude of the first strain ε1 can be detected for any direction by the first to fourth detecting elements 51 to 54.

In one example according to the embodiment, a change rate Cb1 of the fourth signal Sg4 corresponding to the fourth electrical resistance R4 of the fourth detecting element 54 with respect to the change of the strain ε in the first range r1 (referring to FIG. 3E) is lower than the fourth change rate CR4 recited above (referring to FIG. 3D).

As described above, the magnetization 13oM of the third opposing magnetic layer 13o crosses the magnetization 11oM of the first opposing magnetic layer 11o. For example, the angle between the magnetization 13oM of the third opposing magnetic layer 13o and the magnetization 11oM of the first opposing magnetic layer 11o is not less than 45 degrees and not more than 135 degrees. This angle may be, for example, not less than 60 degrees and not more than 120 degrees. The case where this angle is 90 degrees is illustrated in FIG. 3B to FIG. 3E.

For example, the third electrical resistance R3 corresponds to the electrical resistance between the third magnetic layer 13 and the third opposing magnetic layer 13o. For example, the fourth electrical resistance R4 corresponds to the electrical resistance between the fourth magnetic layer 14 and the fourth opposing magnetic layer 14o.

Figure 4:
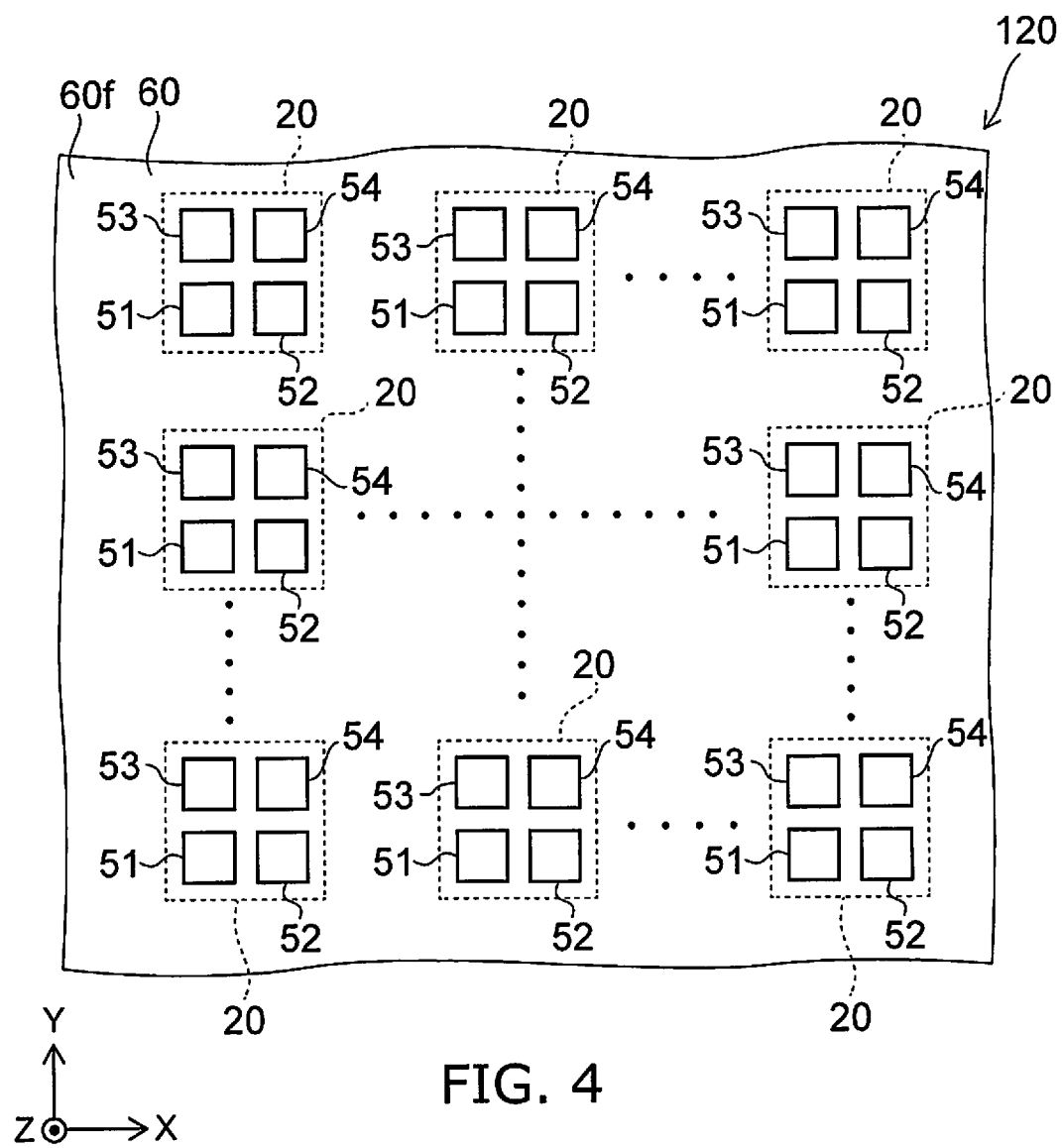
FIG. 4 is a schematic plan view illustrating the sensor according to the second embodiment.

FIG. 4 is a schematic plan view illustrating the sensor according to the second embodiment.

FIG. 4 shows an example of the film portion 60 and the detectors 20. As shown in FIG. 4, multiple detectors 20 may be provided in the sensor 120. In the sensor 120, the positions of the first to fourth detecting elements 51 to 54 are the same in each of the multiple detectors 20.

Figure 5:
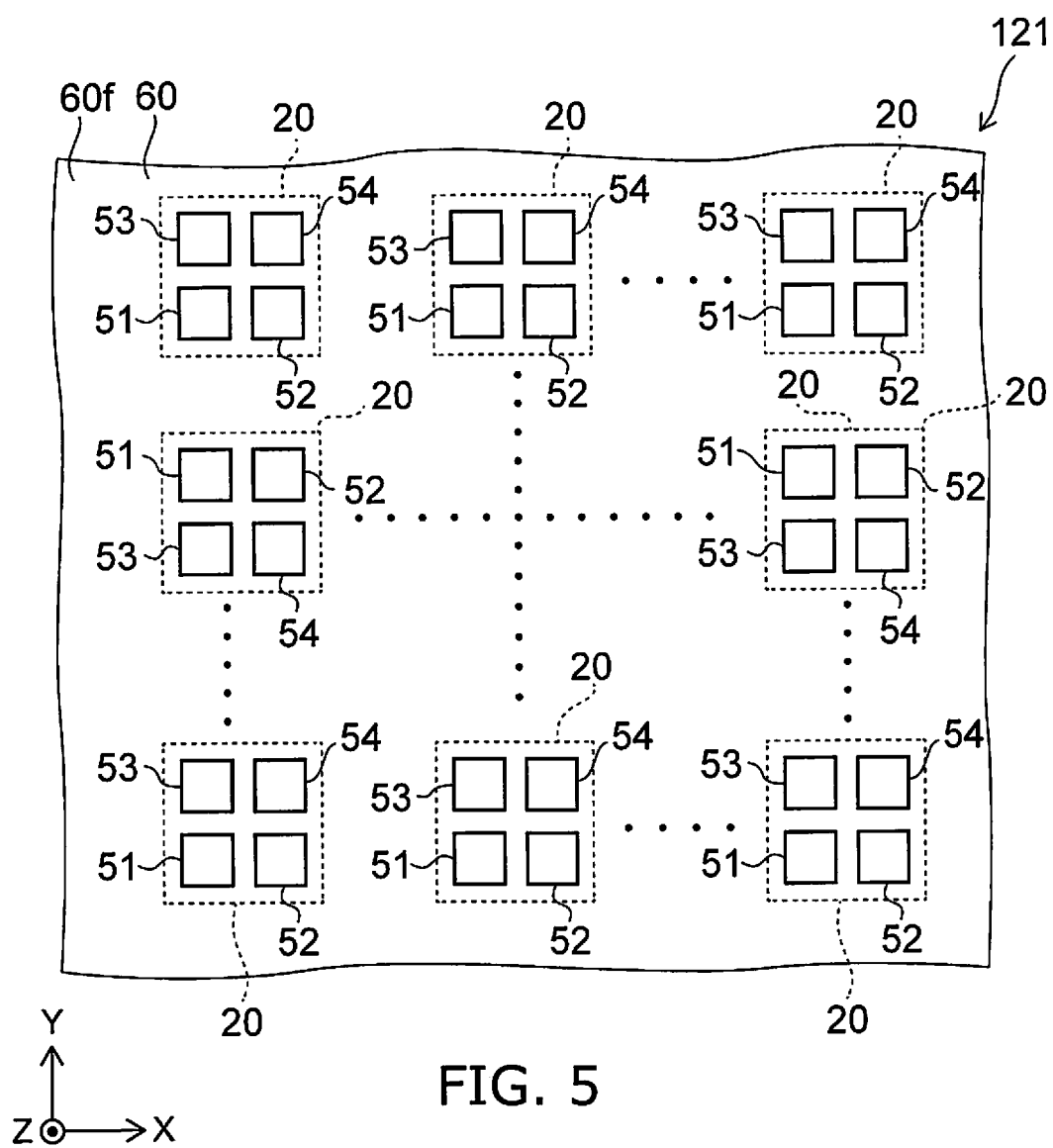
FIG. 5 is a schematic plan view illustrating a sensor according to the second embodiment.

FIG. 5 is a schematic plan view illustrating a sensor according to the second embodiment.

FIG. 5 shows an example of the film portion 60 and the detectors 20. As shown in FIG. 5, multiple detectors 20 are provided in the sensor 121 according to the embodiment as well. In the sensor 121, the first detecting element 51 that is included in one of the multiple detectors 20 is provided between the third detecting element 53 included in the one of the multiple detectors 20 recited above and the third detecting element 53 included in another one of the multiple detectors 20. The first detecting element 51 that is included in the other one of the multiple detectors 20 recited above is provided between the first detecting element 51 included in the one of the multiple detectors 20 recited above and the third detecting element 53 included in the other one of the multiple detectors 20 recited above.

In the sensor 121, the second detecting element 52 that is included in one of the multiple detectors 20 is provided between the fourth detecting element 54 included in the one of the multiple detectors 20 recited above and the fourth detecting element 54 included in another one of the multiple detectors 20. The second detecting element 52 that is included in the other one of the multiple detectors 20 recited above is provided between the second detecting element 52 included in the one of the multiple detectors 20 recited above and the fourth detecting element 54 included in the other one of the multiple detectors 20 recited above.

Thus, various modifications are possible for the positions of the first to fourth detecting elements 51 to 54 in each of the multiple detectors 20.

The sensor 120 according to the second embodiment (referring to FIG. 3A) may include the following configuration. The sensor 120 includes the film portion 60, and one or more detectors 20 fixed to the film portion 60. The detector 20 includes the first to fourth detecting elements 51 to 54. The first detecting element 51 includes the first magnetic layer 11, the first opposing magnetic layer 11o, and the first nonmagnetic layer 11n provided between the first magnetic layer 11 and the first opposing magnetic layer 11o. The second detecting element 52 includes the second magnetic layer 12, the second opposing magnetic layer 12o, and the second nonmagnetic layer 12n provided between the second magnetic layer 12 and the second opposing magnetic layer 12o. The third detecting element 53 includes the third magnetic layer 13, the third opposing magnetic layer 13o, and the third nonmagnetic layer 13n provided between the third magnetic layer 13 and the third opposing magnetic layer 13o. The fourth detecting element 54 includes the fourth magnetic layer 14, the fourth opposing magnetic layer 14o, and the fourth nonmagnetic layer 14n provided between the fourth magnetic layer 14 and the fourth opposing magnetic layer 14o.

For example, the magnetization 11oM of the first opposing magnetic layer 11o is aligned with the magnetization 12oM of the second opposing magnetic layer 12o. The magnetization 13oM of the third opposing magnetic layer 13o is aligned with the magnetization 14oM of the fourth opposing magnetic layer 14o. The magnetization 13oM of the third opposing magnetic layer 13o crosses the magnetization 11oM of the first opposing magnetic layer 11o.

As shown in FIG. 3b to FIG. 3E, the magnitude of the strain ε of the film portion 60 includes the first range r1, and the second range r2 that is larger than the first range r1. The first change rate CR1 of the first signal Sg1 corresponding to the first electrical resistance R1 of the first detecting element 51 is higher than the second change rate CR2 of the first signal Sg1. The first change rate CR1 is the change rate of the first signal Sg1 with respect to the change of the magnitude of the strain ε within the first range r1. The second change rate CR2 is the change rate of the first signal Sg1 with respect to the change of the magnitude of the strain ε within the second range r2. The change rate Ca2 of the second signal Sg2 corresponding to the second electrical resistance R2 of the second detecting element 52 with respect to the change of the magnitude of the strain ε within the second range r2 is higher than the second change rate CR2. The third change rate CR3 of the third signal Sg3 corresponding to the third electrical resistance R3 of the third detecting element 53 is higher than the fourth change rate CR4 of the third signal Sg3. The third change rate CR3 is the change rate of the third signal Sg3 with respect to the change of the strain s within the first range r1. The fourth change rate CR4 is the change rate of the third signal Sg3 with respect to the change of the strain ε within the second range r2. The change rate Cb1 of the fourth signal Sg4 corresponding to the fourth electrical resistance R4 of the fourth detecting element 54 with respect to the change of the strain e within the second range r2 is higher than the fourth change rate CR4 recited above.

As shown in FIG. 4 and FIG. 5, the sensors 120 and 121 may include the film portion 60, multiple first detecting elements 51, and the second detecting element 52. These detecting elements are fixed to the film portion 60. The second detecting element 52 is provided between the multiple first detecting elements 51. The sensors 120 and 121 may include multiple third detecting elements 53 and the fourth detecting element 54. These detecting elements are fixed to the film portion 60. The fourth detecting element 54 is provided between the multiple third detecting elements 53.

The film portion 60, the first detecting element 51, and multiple second detecting elements 52 may be provided. These detecting elements are fixed to the film portion 60. The first detecting element 51 is provided between the multiple second detecting elements 52. The third detecting element 53 and multiple fourth detecting elements 54 may be included. These detecting elements are fixed to the film portion 60. The third detecting element 53 is provided between the multiple fourth detecting elements 54.

In the sensors 110, 120, and 121 recited above, the detector 20 may include the multiple first to fourth detecting elements 51 to 54. Hereinbelow, at least a portion of these detecting elements may be connected electrically in series.

Figure 6A:
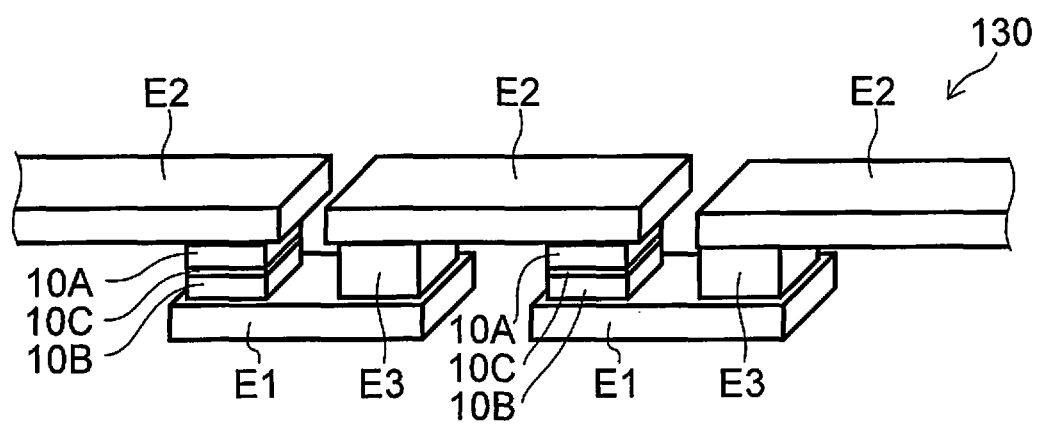
FIG. 6A and FIG. 6B are schematic perspective views illustrating a portion of a sensor according to the embodiment.
Figure 6B:
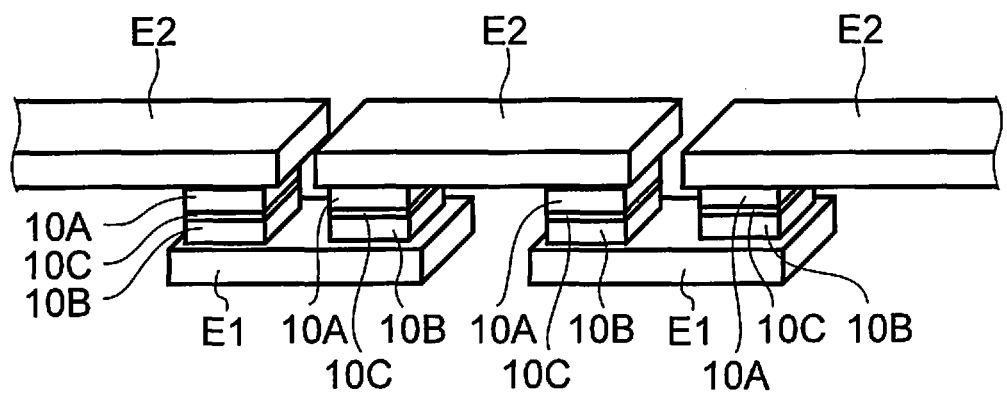

FIG. 6A and FIG. 6B are schematic perspective views illustrating a portion of a sensor according to the embodiment.

Multiple stacked bodies are provided as shown in FIG. 6A. A magnetic layer 10A, a magnetic layer 10B, and a nonmagnetic layer 10C are provided in each of the multiple stacked bodies. The nonmagnetic layer 10C is provided between the magnetic layer 10A and the magnetic layer 10B. The stacked body corresponds to one of the first to fourth detecting elements 51 to 54. For example, the magnetic layer 10A corresponds to one of the first to fourth magnetic layers 11 to 14. For example, the magnetic layer 10B corresponds to one of the first to fourth opposing magnetic layers 11o to 14o. For example, the nonmagnetic layer 10C corresponds to one of the first to fourth nonmagnetic layers 11n to 14n.

One of these multiple stacked bodies is provided between the first conductive portion E1 and the second conductive portion E2. A connecting conductive portion E3 is provided in the example shown in FIG. 6A. At least two of the multiple stacked bodies (at least two of the first to fourth detecting elements 51 to 54) are connected electrically in series via the first conductive portion E1, the second conductive portion E2, and the connecting conductive portion E3.

In the example shown in FIG. 6B, at least two of the multiple stacked bodies (at least two of the first to fourth detecting elements 51 to 54) are connected electrically in series via the first conductive portion E1 and the second conductive portion E2.

The noise can be suppressed by connecting the multiple stacked bodies (any of the first to fourth stacked bodies) electrically in series.

In such a case, the first electrical resistance R1 includes the electrical resistances of the multiple first detecting elements 51. The second electrical resistance R2 includes the electrical resistances of the multiple second detecting elements 52. The third electrical resistance R3 includes the electrical resistances of the multiple third detecting elements 53. The fourth electrical resistance R4 includes the electrical resistances of the multiple fourth detecting elements 54.

FIG. 7A to FIG. 7D are schematic plan views illustrating portions of the sensor according to the embodiment.

These drawings show an example of the configurations of the first to fourth detecting elements 51 to 54. In these drawings, the positions of the magnetic layers and the positions of the opposing magnetic layers are illustrated as being shifted for easier viewing.

Figure 7A:
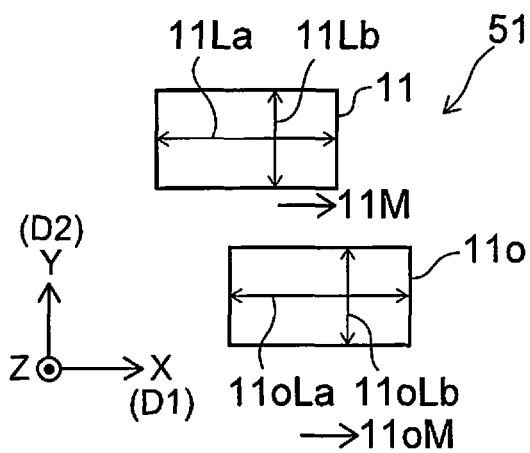
FIG. 7A to FIG. 7D are schematic plan views illustrating portions of the sensor according to the embodiment.

As shown in FIG. 7A, a first length 11La of the first magnetic layer 11 along a first direction D1 is longer than a first cross-direction length 11Lb of the first magnetic layer 11 along a second direction D2 crossing the first direction D1. The first direction D1 and the second direction D2 are along the first surface 60f (referring to FIG. 3A).

Figure 7B:
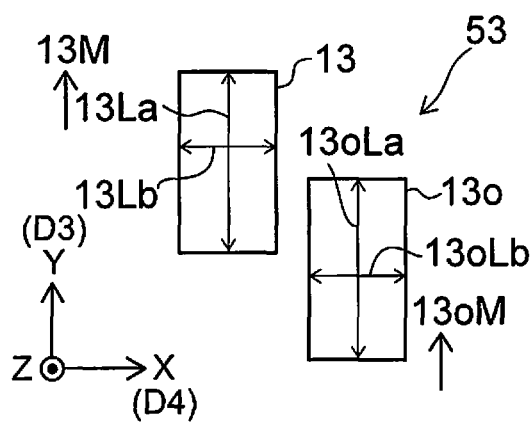
Figure 7C:
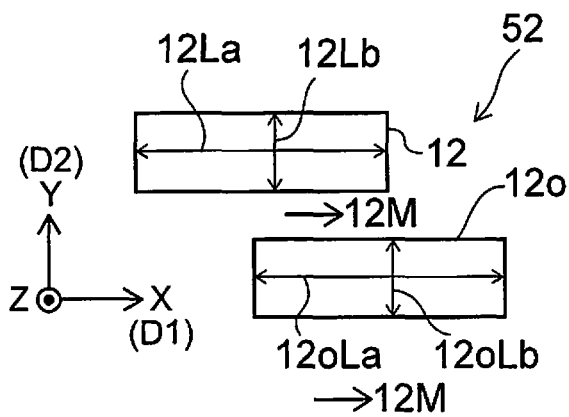

As shown in FIG. 7C, a second length 12La of the second magnetic layer 12 along the first direction D1 is longer than a second cross-direction length 12Lb of the second magnetic layer 12 along the second direction D2.

A length 12Loa of the second opposing magnetic layer 12o along the first direction D1 is longer than a length 12oLb of the second opposing magnetic layer 12o along the second direction D2.

As shown in FIG. 7B, a third length 13La of the third magnetic layer 13 along a third direction D3 along the first surface 60f (referring to FIG. 3A) is longer than a third cross-direction length 13Lb of the third magnetic layer 13 along a fourth direction D4 crossing the third direction D3 along the first surface 60f.

Figure 7D:
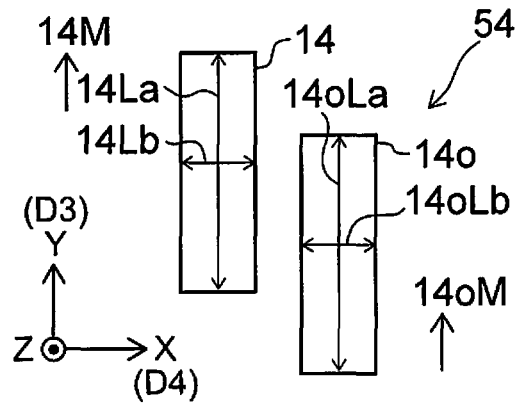

As shown in FIG. 7D, a fourth length 14La of the fourth magnetic layer 14 along the third direction D3 is longer than a fourth cross-direction length 14Lb of the fourth magnetic layer 14 along the fourth direction D4.

For such a first magnetic layer 11, the magnetization 11M of the first magnetic layer 11 is aligned easily with the first direction D1. For such a second magnetic layer 12, the magnetization 12M of the second magnetic layer 12 is aligned easily with the first direction D1. For such a third magnetic layer 13, a magnetization 13M of the third magnetic layer 13 is aligned easily with the third direction D3. For such a fourth magnetic layer 14, a magnetization 14M of the fourth magnetic layer 14 is aligned easily with the third direction D3.

The characteristics illustrated in FIG. 3B to FIG. 3E are easier to obtain using such a configuration.

The third direction D3 crosses the first direction D1. The fourth direction D4 crosses the second direction D2.

For example, the first direction D1 is aligned with the X-axis direction. For example, the second direction D2 is aligned with the Y-axis direction. For example, the third direction D3 is aligned with the Y-axis direction. For example, the fourth direction D4 is aligned with the X-axis direction. For example, the first direction D1 is orthogonal to the second direction D2. For example, the third direction D3 is orthogonal to the fourth direction D4.

The aspect ratios of the first magnetic layer 11 and the second magnetic layer 12 may be different from each other. For example, the ratio of the first length 11La to the first cross-direction length 11Lb is lower than the ratio of the second length 12La to the second cross-direction length 12Lb. Thereby, for example, the magnetization 11M of the first magnetic layer 11 changes more easily than the magnetization 12M of the second magnetic layer 12.

The aspect ratios of the third magnetic layer 13 and the fourth magnetic layer 14 may be different from each other. For example, the ratio of the third length 13La to the third cross-direction length 13Lb is lower than the ratio of the fourth length 14La to the fourth cross-direction length 14Lb. Thereby, for example, the magnetization 13M of the third magnetic layer 13 changes more easily than the magnetization 14M of the fourth magnetic layer 14.

As shown in FIG. 7A, a length 11oLa of the first opposing magnetic layer 11o along the first direction D1 is longer than a length 11oLb of the first opposing magnetic layer 11o along the second direction D2. As shown in FIG. 7C, a length 12oLa of the second opposing magnetic layer 12o along the first direction D1 is longer than the length 12oLb of the second opposing magnetic layer 12o along the second direction D2. As shown in FIG. 7B, a length 13oLa of the third opposing magnetic layer 13o along the third direction D3 is longer than a length 13oLb of the third opposing magnetic layer 13o along the fourth direction D4. As shown in FIG. 7D, a length 14oLa of the fourth opposing magnetic layer 14o along the third direction D3 is longer than a length 14oLb of the fourth opposing magnetic layer 14o along the fourth direction D4.

Configurations such as those shown in FIG. 7A to FIG. 7D provide the magnetic layers with shape anisotropy. For example, the characteristics illustrated in FIG. 3B to FIG. 3E respectively of the first to fourth detecting elements 51 to 54 are easier to obtain by providing the shape anisotropy.

In the embodiment, the first magnetic layer 11 includes, for example, a ferromagnet material. The first magnetic layer 11 includes, for example, a ferromagnet material including Fe, Co, and Ni. The first magnetic layer 11 includes, for example, an FeCo alloy, etc. The first magnetic layer 11 includes, for example, at least one selected from the group consisting of a Co—Fe—B alloy, an Fe—Co—Si—B alloy, an Fe—Ga alloy having a large λs (magnetostriction constant), an Fe—Co—Ga alloy, a Tb—M—Fe alloy, a Tb—M1—Fe—M2 alloy, an Fe—M3—M4—B alloy, Ni, Fe—Al, and ferrite. For example, the λs (the magnetostriction constant) is large for these materials. In the Tb—M—Fe alloy recited above, M is at least one selected from the group consisting of Sm, Eu, Gd, Dy, Ho, and Er. In the Tb—M1—Fe—M2 alloy recited above, M1 is at least one selected from the group consisting of Sm, Eu, Gd, Dy, Ho, and Er. M2 is at least one selected from the group consisting of Ti, Cr, Mn, Co, Cu, Nb, Mo, W, and Ta. In the Fe—M3—M4—B alloy recited above, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. The ferrite recited above includes at least one selected from the group consisting of $Fe_3O_4$ and $(FeCo)_3O_4$. The thickness of the first magnetic layer 11 is, for example, 2 nm or more.

The first magnetic layer 11 may include a magnetic material including boron. The first magnetic layer 11 may include, for example, an alloy including boron (B) and at least one element selected from the group consisting of Fe, Co, and Ni. The first magnetic layer 11 may include, for example, a Co—Fe—B alloy or an Fe—B alloy. For example, the first magnetic layer 11 includes a $Co_{40}Fe_{40}B_{20}$ alloy. In the case where the first magnetic layer 11 includes an alloy including boron (B) and at least one element selected from the group consisting of Fe, Co, and Ni, the first magnetic layer 11 may further include at least one selected from the group consisting of Ga, Al, Si, and W. By including these elements, for example, a high magnetostriction constant is obtained easily. The first magnetic layer 11 may include, for example, an Fe—Ga—B alloy, an Fe—Co—Ga—B alloy, or an Fe—Co—Si—B alloy. By the first magnetic layer 11 including such a magnetic material including boron, for example, the coercivity (Hc) of the first magnetic layer 11 is low. For example, the change of the magnetization direction with respect to the strain is easy. High sensitivity is obtained thereby.

It is favorable for the boron concentration (e.g., the composition ratio of boron) of the first magnetic layer 11 to be 5 at. % (atomic percent) or more. Thereby, an amorphous structure is easier to obtain. It is favorable for the boron concentration of the first magnetic layer 11 (e.g., the free magnetic layer) to be 35 at. % or less. For example, the magnetostriction constant decreases when the boron concentration is too high. It is favorable for the boron concentration of the first magnetic layer 11 to be, for example, not less than 5 at. % and not more than 35 at. %; and it is more favorable to be not less than 10 at. % and not more than 30 at. %.

For example, a large magnetostriction constant λ and a low coercivity are obtained easily when a portion of the magnetic film included in the first magnetic layer 11 includes $Fe_{1-y}B_y$ (0<y≤0.3) or $(Fe_zX_{1-z})_{1-y}B_y$ (X being Co or Ni, 0.8≤z<1, and 0<y≤0.3). Therefore, this is particularly favorable from the perspective of obtaining a high strain sensitivity. For example, the first magnetic layer 11 includes $Fe_{80}B_{20}$ (having a thickness of 4 nm). For example, the first magnetic layer 11 includes $Co_{40}Fe_{40}B_{20}$ (having a thickness of 0.5 nm)/$Fe_{80}B_{20}$ (having a thickness of 4 nm).

The second magnetic layer 12 may include, for example, the same material as the first magnetic layer 11. The third magnetic layer 13 may include the same material as the first magnetic layer 11. The fourth magnetic layer 14 may include the same material as the first magnetic layer 11.

In the embodiment, the second magnetic layer 12 may include a material different from the first magnetic layer 11. The fourth magnetic layer 14 may include a material different from the first magnetic layer 11.

For example, the compositions of the second magnetic layer 12 (and the fourth magnetic layer 14) are different from the compositions of the first magnetic layer 11 (and the third magnetic layer 13). For example, the first magnetic layer 11 (and the third magnetic layer 13) include at least one of Fe, Co, or Ni having a first concentration. The second magnetic layer 12 (and the fourth magnetic layer 14) include the at least one of Fe, Co, or Ni recited above having a second concentration. The second concentration is different from the first concentration.

For example, the concentration (the composition ratio) of Fe in the second magnetic layer 12 (and the fourth magnetic layer 14) is different from the concentration (the composition ratio) of Fe in the first magnetic layer 11 (and the third magnetic layer 13). For example, the concentration (the composition ratio) of Co in the second magnetic layer 12 (and the fourth magnetic layer 14) is different from the concentration (the composition ratio) of Co in the first magnetic layer 11 (and the third magnetic layer 13). For example, the concentration (the composition ratio) of Ni in the second magnetic layer 12 (and the fourth magnetic layer 14) is different from the concentration (the composition ratio) of Ni in the first magnetic layer 11 (and the third magnetic layer 13).

For example, the concentration of B (boron) may be different between the first magnetic layer 11 (and the third magnetic layer 13) and the second magnetic layer 12 (and the fourth magnetic layer 14). For example, the composition ratio of B in the first magnetic layer 11 (and the third magnetic layer 13) is not less than 10 at. % and not more than 30 at. %. For example, the composition ratio of B in the second magnetic layer 12 (and the fourth magnetic layer 14) is not less than 0 at. % but less than 10 at. %. For example, the first magnetic layer 11 (and the third magnetic layer 13) include B and at least one of Fe, Co, or Ni. The second magnetic layer 12 (and the fourth magnetic layer 14) may include at least one of Fe, Co, or Ni but not include B.

For example, the first magnetic layer 11 (and the third magnetic layer 13) include B and at least one of Fe, Co, or Ni. The second magnetic layer 12 (and the fourth magnetic layer 14) include B and at least one of Fe, Co, or Ni. The concentration (the composition ratio) of B included in the second magnetic layer 12 (and the fourth magnetic layer 14) is lower than the concentration (the composition ratio) of B included in the first magnetic layer 11 (and the third magnetic layer 13). For example, the composition ratio of Fe in the first magnetic layer 11 (and the third magnetic layer 13) is not less than 60 at. % (atomic percent) and not more than 100 at. %. For example, the composition ratio of Fe in the second magnetic layer 12 (and the fourth magnetic layer 14) is not less than 0 at. % but less than 60 at. %. For example, the composition ratio of B in the first magnetic layer 11 (and the third magnetic layer 13) is not less than 10 at. % and not more than 30 at. %. For example, the composition ratio of B in the second magnetic layer 12 (and the fourth magnetic layer 14) is not less than 0 at. % but less than 10 at. %.

For example, the first magnetic layer 11 (and the third magnetic layer 13) include $Co_{40}Fe_{40}B_{20}$. For example, the second magnetic layer 12 (and the fourth magnetic layer 14) include $Co_{50}Fe_{50}$.

For example, the first magnetic layer 11 (and the third magnetic layer 13) include $Fe_{80}B_{20}$. For example, the second magnetic layer 12 (and the fourth magnetic layer 14) include $Co_{40}Fe_{40}B_{20}$.

For example, the compositions of these magnetic layers are determined using an analysis method combining a cross-section TEM (Transmission Electron Microscope) and EDX (Energy Dispersive X-ray Spectroscopy). For example, the compositions of these magnetic layers are determined using an analysis method combining cross-section TEM and EELS (Electron Energy-Loss Spectroscopy). For example, the compositions of these magnetic layers are determined using an analysis method such as SIMS (Secondary Ion Mass Spectrometry), etc.

For example, the crystallinity may be different between the first magnetic layer 11 (and the third magnetic layer 13) and the second magnetic layer 12 (and the fourth magnetic layer 14). For example, the first magnetic layer 11 (and the third magnetic layer 13) includes amorphous regions. The second magnetic layer 12 (and the fourth magnetic layer 14) include crystal regions. For example, the second magnetic layer 12 (and the fourth magnetic layer 14) do not include amorphous regions. For example, the amount of the amorphous region (e.g., the area of the amorphous region per unit cross-sectional area) in the second magnetic layer 12 (and the fourth magnetic layer 14) is less than the amount of the amorphous region (e.g., the area of the amorphous region per unit cross-sectional area) in the first magnetic layer 11' (and the third magnetic layer 13). For example, the first magnetic layer 11 (and the third magnetic layer 13) substantially may not include crystal regions.

For example, the crystallinity of these magnetic layers is determined using an analysis method such as cross-section TEM (Transmission Electron Microscope), etc.

For example, the characteristics illustrated in FIG. 3B to FIG. 3E respectively of the first to fourth detecting elements 51 to 54 are easier to obtain due to such material differences.

In the embodiment, the first opposing magnetic layer 11o includes, for example, a ferromagnet material. The first opposing magnetic layer 11o includes, for example, a ferromagnet material including Fe, Co, and Ni. The first opposing magnetic layer 11o includes, for example, NiFe, etc. The first opposing magnetic layer 11o includes, for example, NiFeCo, etc. The first opposing magnetic layer 11o may include a material having a low λs (magnetostriction constant), or in which the λs (the magnetostriction constant) is substantially zero. Thereby, for example, compared to the first magnetic layer 11, the magnetization rotation due to the strain does not occur easily. Or, the magnetization rotation due to the strain substantially does not occur. For example, the first opposing magnetic layer 11o includes a magnetic layer including $Ni_{1-y}Fe_y$ (0.15≤y≤0.25).

In the embodiment, the first nonmagnetic layer 11n includes, for example, a metal, an insulator, or a semiconductor. The metal includes, for example, at least one selected from the group consisting of Cu, Au, and Ag. In the case where the first nonmagnetic layer 11n includes a metal, the thickness of the first nonmagnetic layer 11n is, for example, not less than about 1 nm and not more than about 7 nm. The insulator recited above or the semiconductor recited above includes, for example, at least one selected from the group consisting of magnesium oxide (MgO, etc.), aluminum oxide ($Al_2O_3$, etc.), titanium oxide (TiO, etc.), zinc oxide (ZnO, etc.), and gallium oxide (Ga—O). In the case where the first nonmagnetic layer 11n includes an insulator or a semiconductor, the thickness of the first nonmagnetic layer 11n is, for example, not less than about 0.6 nm and not more than about 3 nm. For example, the first nonmagnetic layer 11n includes a MgO layer having a thickness of 2 nm.

Figure 8:
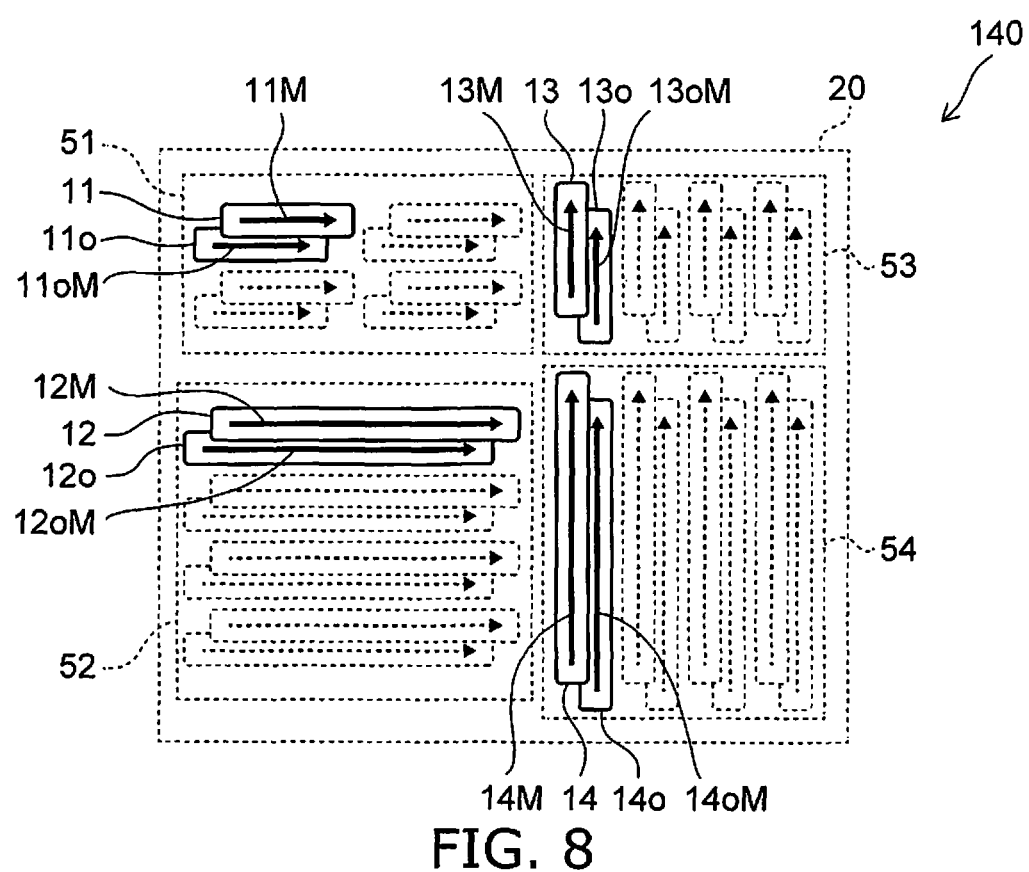
FIG. 8 is a schematic plan view illustrating a portion of a sensor according to the embodiment.

FIG. 8 is a schematic plan view illustrating a portion of a sensor according to the embodiment.

For easier viewing of FIG. 8, the nonmagnetic layers are not illustrated. Also, the positions of the magnetic layers and the positions of the opposing magnetic layers are illustrated as being shifted.

In the sensor 140 according to the embodiment as shown in FIG. 8, the first to fourth detecting elements 51 to 54 are provided in the detector 20. The first detecting element 51 includes multiple stacked bodies. One of the multiple stacked bodies includes the first magnetic layer 11 and the first opposing magnetic layer 11o. The second detecting element 52 includes multiple stacked bodies. One of the multiple stacked bodies includes the second magnetic layer 12 and the second opposing magnetic layer 12o. The third detecting element 53 includes multiple stacked bodies. One of the multiple stacked bodies includes the third magnetic layer 13 and the third opposing magnetic layer 13o. The fourth detecting element 54 includes multiple stacked bodies. One of the multiple stacked bodies includes the fourth magnetic layer 14 and the fourth opposing magnetic layer 14o.

As described in reference to FIG. 6A and FIG. 6B, at least two of the multiple first detecting elements 51 are connected electrically in series.

Figure 9:
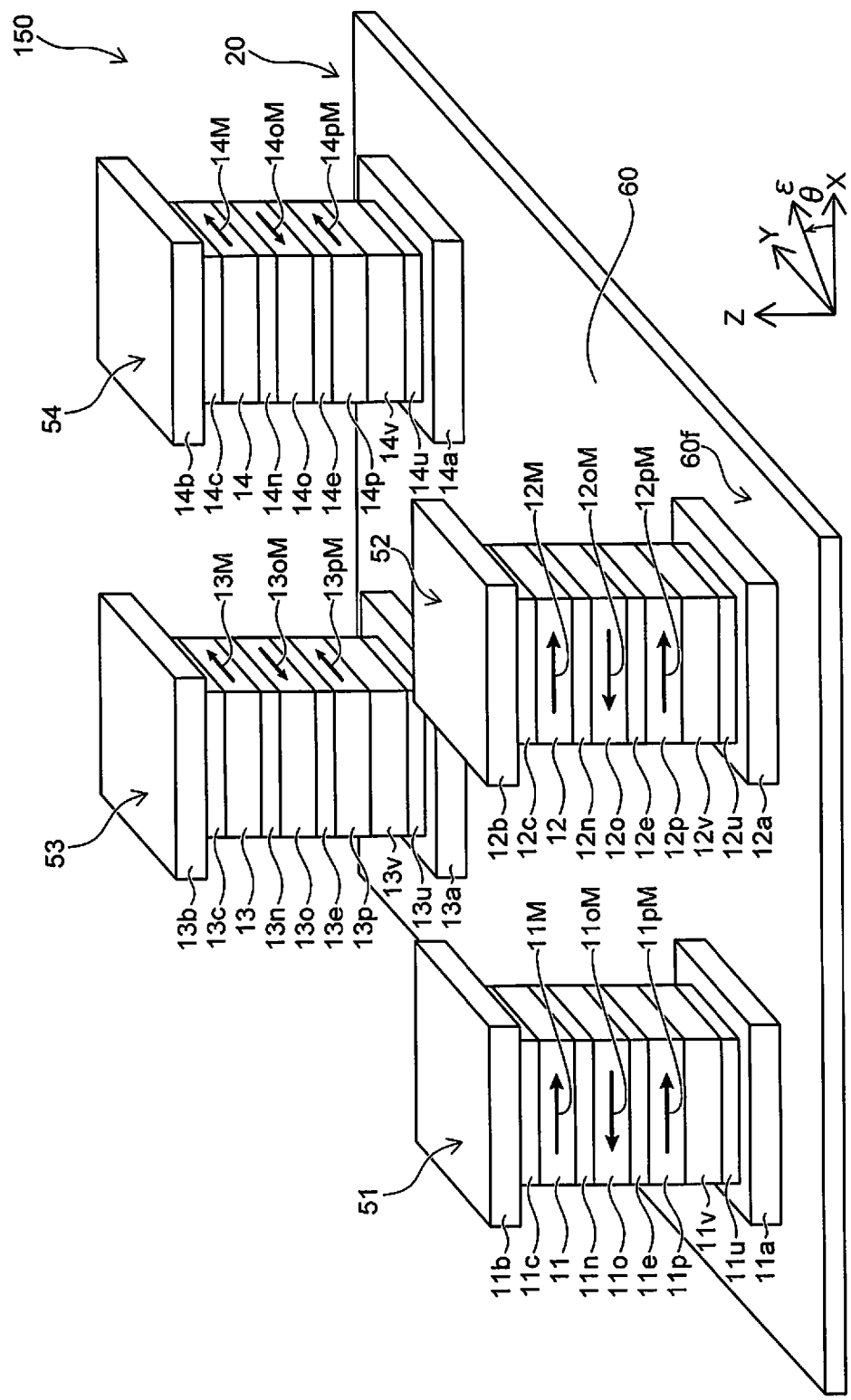
FIG. 9 is a schematic perspective view illustrating a sensor according to the embodiment.

FIG. 9 is a schematic perspective view illustrating a sensor according to the embodiment.

In the sensor 150 according to the embodiment as shown in FIG. 9, the first to fourth detecting elements 51 to 54 are provided in the detector 20.

The first detecting element 51 includes a first lower electrode 11a, a first foundation layer 11u, a first pinning layer 11v, a first pinned magnetic layer 11p, a first magnetic coupling layer 11e, the first opposing magnetic layer 11o, the first nonmagnetic layer 11n, the first magnetic layer 11, a first capping layer 11c, and a first upper electrode 11b.

The second detecting element 52 includes a second lower electrode 12a, a second foundation layer 12u, a second pinning layer 12v, a second pinned magnetic layer 12p, a second magnetic coupling layer 12e, the second opposing magnetic layer 12o, the second nonmagnetic layer 12n, the second magnetic layer 12, a second capping layer 12c, and a second upper electrode 12b.

The third detecting element 53 includes a third lower electrode 13a, a third foundation layer 13u, a third pinning layer 13v, a third pinned magnetic layer 13p, a third magnetic coupling layer 13e, the third opposing magnetic layer 13o, the third nonmagnetic layer 13n, the third magnetic layer 13, a third capping layer 13c, and a third upper electrode 13b.

The fourth detecting element 54 includes a fourth lower electrode 14a, a fourth foundation layer 14u, a fourth pinning layer 14v, a fourth pinned magnetic layer 14p, a fourth magnetic coupling layer 14e, the fourth opposing magnetic layer 14o, the fourth nonmagnetic layer 14n, the fourth magnetic layer 14, a fourth capping layer 14c, and a fourth upper electrode 14b.

In the example of the first to fourth detecting elements 51 to 54 shown in FIG. 9, the first magnetic layer 11, the second magnetic layer 12, the third magnetic layer 13, and the fourth magnetic layer 14 are free magnetic layers. The first opposing magnetic layer 11o, the second opposing magnetic layer 12o, the third opposing magnetic layer 13o, and the fourth opposing magnetic layer 14o are fixed magnetic layers. The magnetization is fixed for the fixed magnetic layers.

The first lower electrode 11a and the first upper electrode 11b include, for example, at least one of aluminum (Al), aluminum copper alloy (Al—Cu), copper (Cu), silver (Ag), or gold (Au). The electrical resistance is relatively low for these materials; for example, the current can be caused to flow efficiently in the first detecting element 51 by the first lower electrode 11a and the first upper electrode 11b including these materials. The first lower electrode 11a and the first upper electrode 11b include nonmagnetic materials.

The first lower electrode 11a and the first upper electrode 11b may include, for example, a first lower electrode film (not illustrated), a first upper electrode film (not illustrated), capping layers (not illustrated) for the first lower electrode 11a and the first upper electrode 11b, and layers including at least one selected from the group consisting of Al, Al—Cu, Cu, Ag, and Au provided between such layers. For example, the first lower electrode 11a and the first upper electrode 11b may include tantalum (Ta)/copper (Cu)/tantalum (Ta), etc.

For example, the adhesion between the substrate (e.g., the film portion 60) and the first lower electrode 11*a* is improved by including Ta in the foundation layers of the first lower electrode 11*a* and the first upper electrode 11*b*. The foundation layers for the first lower electrode 11*a* and the first upper electrode 11*b* may include titanium (Ti), titanium nitride (TiN), etc.

By including Ta in the capping layers of the first lower electrode 11*a* and the first upper electrode 11*b*, oxidization of the copper (Cu), etc., under the capping layers is suppressed. The capping layers for the first lower electrode 11*a* and the first upper electrode 11*b* may include titanium (Ti), titanium nitride (TiN), etc.

The second lower electrode 12*a*, the third lower electrode 13*a*, and the fourth lower electrode 14*a* include, for example, the materials described in reference to the first lower electrode 11*a*. The second lower electrode 12*a*, the third lower electrode 13*a*, and the fourth lower electrode 14*a* may include, for example, the same material as the first lower electrode 11*a*.

The second upper electrode 12*b*, the third upper electrode 13*b*, and the fourth upper electrode 14*b* include, for example, the materials described in reference to the first upper electrode 11*b*. The second upper electrode 12*b*, the third upper electrode 13*b*, and the fourth upper electrode 14*b* may include, for example, the same material as the first upper electrode 11*b*.

For example, the first foundation layer 11*u* may have a stacked structure including a buffer layer (not illustrated) and a seed layer (not illustrated). For example, the buffer layer relaxes the roughness of the surfaces of the first lower electrode 11*a*, the film portion 60, etc. For example, the buffer layer improves the crystallinity of the layers stacked on the buffer layer. The buffer layer includes, for example, at least one selected from the group consisting of tantalum (Ta), titanium (Ti), vanadium (V), tungsten (W), zirconium (Zr), hafnium (Hf), and chrome (Cr). An alloy including at least one selected from the group recited above may be included as the buffer layer.

It is favorable for the thickness of the buffer layer included in the first foundation layer 11*u* to be, for example, not less than 1 nm and not more than 10 nm. It is more favorable for the thickness of the buffer layer to be not less than 1 nm and not more than 5 nm. In the case where the buffer layer is too thin, the buffering effect may be insufficient. In the case where the buffer layer is too thick, the thickness of the first detecting element 51 becomes excessively thick. For example, a buffering effect may be provided by forming a seed layer on the buffer layer. In such a case, the buffer layer may be omitted. The buffer layer includes, for example, a Ta layer having a thickness of 3 nm.

The seed layer that is included in the first foundation layer 11*u* controls the crystal orientation of the layers stacked on the seed layer. The seed layer controls the crystal grain size of the layers stacked on the seed layer. The seed layer includes a metal having a fcc structure (face-centered cubic structure), a hcp structure (hexagonal close-packed structure), a bcc structure (body-centered cubic structure), etc.

The seed layer that is included in the first foundation layer 11*u* includes ruthenium (Ru) having a hcp structure, NiFe having a fcc structure, or Cu having a fcc structure. Thereby, for example, the crystal orientation of the magnetic layer on the seed layer can be the fcc (111) orientation. The seed layer may include, for example, a Cu layer having a thickness of 2 nm or a Ru layer having a thickness of 2 nm. It is favorable for the thickness of the seed layer to be not less than 1 nm and not more than 5 nm. In such a case, for example, the crystal orientation of the layers formed on the seed layer can be increased. It is more favorable for the thickness of the seed layer to be not less than 1 nm and not more than 3 nm. Thereby, the function of the seed layer improving the crystal orientation is realized sufficiently.

The second foundation layer 12*u*, the third foundation layer 13*u*, and the fourth foundation layer 14*u* include the materials described in reference to the first foundation layer 11*u*. The second foundation layer 12*u*, the third foundation layer 13*u*, and the fourth foundation layer 14*u* may include the same material as the first foundation layer 11*u*.

For example, the first pinning layer 11*v* provides unidirectional anisotropy to the first pinned magnetic layer 11*p* (the ferromagnetic layer) formed on the first pinning layer 11*v* and fixes the magnetization of the first pinned magnetic layer 11*p*. The first pinning layer 11*v* includes, for example, an antiferromagnetic layer. The first pinning layer 11*v* includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The first pinning layer 11*v* may include an alloy including another element and at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the first pinning layer 11*v* is set appropriately. For example, the first pinned magnetic layer 11*p* is provided with unidirectional anisotropy of sufficient strength.

For example, heat treatment is performed while applying a magnetic field. Thereby, for example, the magnetization of the ferromagnetic layer contacting the first pinning layer 11*v* is fixed. The magnetization of the ferromagnetic layer contacting the first pinning layer 11*v* is fixed in the direction of the magnetic field applied in the heat treatment. For example, the heat treatment temperature (the annealing temperature) is not less than the magnetization pinning temperature of the antiferromagnetic material included in the first pinning layer 11*v*. For example, in the case where the first pinning layer 11*v* includes an antiferromagnetic layer including Mn, the MR ratio may decrease due to the Mn diffusing into layers other than the first pinning layer 11*v*. It is desirable to set the heat treatment temperature to be not more than the temperature at which the diffusion of Mn occurs. The heat treatment temperature is, for example, not less than 200° C. and not more than 500° C. It is favorable for the heat treatment temperature to be, for example, not less than 250° C. and not more than 400° C.

In the case where the first pinning layer 11*v* includes PtMn or PdPtMn, it is favorable for the thickness of the first pinning layer 11*v* to be not less than 8 nm and not more than 20 nm. It is more favorable for the thickness of the first pinning layer 11*v* to be not less than 10 nm and not more than 15 nm. Unidirectional anisotropy can be provided to the other layers by a thinner thickness when the first pinning layer 11*v* includes IrMn than when the first pinning layer 11*v* includes PtMn. In the case where the first pinning layer 11*v* includes IrMn, it is favorable for the thickness of the first pinning layer 11*v* to be not less than 4 nm and not more than 18 nm. It is more favorable for the thickness of the first pinning layer 11*v* to be not less than 5 nm and not more than 15 nm. The first pinning layer 11*v* includes, for example, an $Ir_{22}Mn_{78}$ layer having a thickness of 7 nm.

The first pinning layer 11*v* may include a hard magnetic layer. The hard magnetic layer includes, for example, at least one selected from the group consisting of Co—Pt, Fe—Pt, Co—Pd, and Fe—Pd. For example, the magnetic anisotropy and the coercivity are relatively high for these materials.

These materials are hard magnetic materials. The first pinning layer 11v may include an alloy including another element and at least one selected from the group consisting of Co—Pt, Fe—Pt, Co—Pd, and Fe—Pd. For example, the first pinning layer 11v may include CoPt (the ratio of Co being not less than 50 at. % and not more than 85 at. %), $(Co_xPt_{100-x})_{100-y}Cr_y$, (x being not less than 50 at. % and not more than 85 at. %, and y being not less than 0 at. % and not more than 40 at. %), or FePt (the ratio of Pt being not less than 40 at. % and not more than 60 at. %).

The second pinning layer 12v, the third pinning layer 13v, and the fourth pinning layer 14v include, for example, the materials described in reference to the first pinning layer 11v. The second pinning layer 12v, the third pinning layer 13v, and the fourth pinning layer 14v may include, for example, the same material as the first pinning layer 11v.

The third pinning layer 13v (and the fourth pinning layer 14v) may include a material different from the first pinning layer 11v and the second pinning layer 12v. For example, the third pinning layer 13v (and the fourth pinning layer 14v) may include a Pt—Mn alloy; and the first pinning layer 11v (and the second pinning layer 12v) may include an Ir—Mn alloy. Thus, by using different materials, the magnetization 13oM of the third opposing magnetic layer (and the magnetization 14oM of the fourth opposing magnetic layer) can easily cross the magnetization 11oM of the first opposing magnetic layer (and the magnetization 12oM of the second opposing magnetic layer) (referring to FIG. 9).

The first pinned magnetic layer 11p includes, for example, at least one selected from the group consisting of a $Co_xFe_{100-x}$ alloy (x being not less than 0 at. % and not more than 100 at. %) and a $Ni_xFe_{100-x}$ alloy (x being not less than 0 at. % and not more than 100 at. %). The first pinned magnetic layer 11p may include a material including these materials and a nonmagnetic element. The first pinned magnetic layer 11p includes, for example, at least one selected from the group consisting of Co, Fe, and Ni. The first pinned magnetic layer 11p may include an alloy including at least one selected from the group consisting of Co, Fe, and Ni.

It is favorable for the thickness of the first pinned magnetic layer 11p to be, for example, not less than 1.5 nm and not more than 5 nm. Thereby, for example, the strength of the unidirectional anisotropic magnetic field due to the first pinned magnetic layer 11p can be stronger. For example, the strength of the antiferromagnetic coupling magnetic field between the first pinned magnetic layer 11p and the first opposing magnetic layer 11o via the magnetic coupling layer formed on the first pinned magnetic layer 11p can be stronger. For example, it is favorable for the magnetic thickness (the product of the saturation magnetization and the thickness) of the first pinned magnetic layer 11p to be substantially equal to the magnetic thickness of the first opposing magnetic layer 11o.

In the sensor 150 illustrated in FIG. 9, a synthetic pinned structure that is made of the first pinned magnetic layer 11p, the first magnetic coupling layer 11e, and the first opposing magnetic layer 11o is provided in the first detecting element 51. A single pinned structure having one fixed magnetic layer may be provided in the first detecting element 51. In such a case, the first pinned magnetic layer 11p and the first magnetic coupling layer 11e are omitted.

The second pinned magnetic layer 12p, the third pinned magnetic layer 13p, and the fourth pinned magnetic layer 14p include, for example, the materials described in reference to the first pinned magnetic layer 11p. The second pinned magnetic layer 12p, the third pinned magnetic layer 13p, and the fourth pinned magnetic layer 14p may include, for example, the same material as the first pinned magnetic layer 11p.

The first magnetic coupling layer 11e causes antiferromagnetic coupling between the first pinned magnetic layer 11p and the first opposing magnetic layer 11o. The first magnetic coupling layer 11e forms a synthetic pinned structure. The first magnetic coupling layer 11e includes, for example, Ru. It is favorable for the thickness of the first magnetic coupling layer 11e to be, for example, not less than 0.8 nm and not more than 1 nm. The first magnetic coupling layer 11e includes a material causing a sufficient antiferromagnetic coupling between the first pinned magnetic layer 11p and the first opposing magnetic layer 11o. For example, the first magnetic coupling layer 11e includes Ir. For example, the thickness of the first magnetic coupling layer 11e is set to a thickness not less than 0.8 nm and not more than 1 nm which corresponds to the second peak (2nd peak) of RKKY (Ruderman-Kittel-Kasuya-Yosida) coupling. The thickness of the first magnetic coupling layer 11e may be set to a thickness not less than 0.3 nm and not more than 0.6 nm which corresponds to the first peak (1st peak) of RKKY coupling. The material of the first magnetic coupling layer 11e includes, for example, a Ru layer having a thickness of 0.9 nm. Thereby, highly-reliability coupling is obtained more stably.

The second magnetic coupling layer 12e, the third magnetic coupling layer 13e, and the fourth magnetic coupling layer 14e include, for example, the materials described in reference to the first magnetic coupling layer 11e. The second magnetic coupling layer 12e, the third magnetic coupling layer 13e, and the fourth magnetic coupling layer 14e include, for example, the same material as the first magnetic coupling layer 11e.

The first opposing magnetic layer 11o includes, for example, a Co—Fe—B alloy. The first opposing magnetic layer 11o includes, for example, a $(Co_xFe_{100-x})_{100-y}B_y$ alloy (x being not less than 0 at. % and not more than 100 at. %, and y being not less than 0 at. % and not more than 30 at. %).

The layer (e.g., the first nonmagnetic layer 11n) that is formed on the first opposing magnetic layer 11o can be planarized. The defect density of the first nonmagnetic layer 11n can be reduced by planarizing the first nonmagnetic layer 11n. Thereby, a higher MR ratio is obtained using a lower resistance per area. For example, in the case where the first nonmagnetic layer 11n includes MgO, the first opposing magnetic layer 11o includes, for example, an amorphous alloy of $(Co_xFe_{100-x})_{100-y}B_y$. In such a case, the (100) orientation of the MgO layer can be strengthened. A higher MR ratio is obtained by increasing the (100) orientation of the MgO layer. The $(Co_xFe_{100-x})_{100-y}B_y$ alloy is crystallized using the (100) plane of the MgO layer as a template when annealing. Good crystal conformation between the MgO and the $(Co_xFe_{100-x})_{100-y}B_y$ alloy is obtained thereby. By obtaining good crystal conformation, a higher MR ratio is obtained.

The first opposing magnetic layer 11o may include, for example, an Fe—Co alloy.

A higher MR ratio is obtained when the first opposing magnetic layer 11o is thick. For example, a larger fixed magnetic field is obtained when the first opposing magnetic layer 11o is thin. The thickness of the first opposing magnetic layer 11o has a trade-off relationship between the MR ratio and the fixed magnetic field. In the case where the first opposing magnetic layer 11o includes a Co—Fe—B alloy, it is favorable for the thickness of the first opposing magnetic layer 11*o* to be not less than 1.5 nm and not more than 5 nm. It is more favorable for the thickness of the first opposing magnetic layer 11*o* to be not less than 2.0 nm and not more than 4 nm.

The first opposing magnetic layer 11*o* includes at least one selected from the group consisting of a $Co_{90}Fe_n$ alloy having a fcc structure, Co having a hcp structure, and a Co alloy having a hcp structure. The first opposing magnetic layer 11*o* includes, for example, at least one selected from the group consisting of Co, Fe, and Ni. The first opposing magnetic layer 11*o* may include, for example, an alloy including at least one selected from the group consisting of Co, Fe, and Ni. For example, a higher MR ratio is obtained for the first opposing magnetic layer 11*o* by including at least one selected from the group consisting of an FeCo alloy having a bcc structure, a Co alloy having a cobalt composition of 50% or more, and a material (a Ni alloy) having a Ni composition of 50% or more.

The second opposing magnetic layer 12*o*, the third opposing magnetic layer 13*o*, and the fourth opposing magnetic layer 14*o* include, for example, the materials described in reference to the first opposing magnetic layer 11*o*. The second opposing magnetic layer 12*o*, the third opposing magnetic layer 13*o*, and the fourth opposing magnetic layer 14*o* may include, for example, the same material as the first opposing magnetic layer 11*o*.

The first nonmagnetic layer 11*n*, the second nonmagnetic layer 12*n*, the third nonmagnetic layer 13*n*, and the fourth nonmagnetic layer 14*n* respectively include, for example, the materials described in reference to the first nonmagnetic layer 11*n*, the second nonmagnetic layer 12*n*, the third nonmagnetic layer 13*n*, and the fourth nonmagnetic layer 14*n* of the sensor 120 described above. The first nonmagnetic layer 11*n*, the second nonmagnetic layer 12*n*, the third nonmagnetic layer 13*n*, and the fourth nonmagnetic layer 14*n* may respectively include, for example, the same materials as the first nonmagnetic layer 11*n*, the second nonmagnetic layer 12*n*, the third nonmagnetic layer 13*n*, and the fourth nonmagnetic layer 14*n* of the sensor 120 described above.

The first magnetic layer 11, the second magnetic layer 12, the third magnetic layer 13, and the fourth magnetic layer 14 may respectively include, for example, the materials described in reference to the first magnetic layer 11, the second magnetic layer 12, the third magnetic layer 13, and the fourth magnetic layer 14 of the sensor 120 described above. The first magnetic layer 11, the second magnetic layer 12, the third magnetic layer 13, and the fourth magnetic layer 14 may respectively include, for example, the same materials as the first magnetic layer 11, the second magnetic layer 12, the third magnetic layer 13, and the fourth magnetic layer 14 of the sensor 120 described above.

The first capping layer 11*c* protects the layers provided under the first capping layer 11*c*. The first capping layer 11*c* includes, for example, multiple metal layers. For example, the first capping layer 11*c* has a two-layer structure (Ta/Ru) of a Ta layer and a Ru layer. The thickness of the Ta layer is, for example, 1 nm; and the thickness of the Ru layer is, for example, 5 nm. The first capping layer 11*c* may include other metal layers. The configuration of the first capping layer 11*c* is arbitrary. For example, the first capping layer 11*c* includes a nonmagnetic material. For example, the first capping layer 11*c* may include other materials that can protect the layers provided under the first capping layer 11*c*.

The second capping layer 12*c*, the third capping layer 13*c*, and the fourth capping layer 14*c* include the materials described in reference to the first capping layer 11*c*. The second capping layer 12*c*, the third capping layer 13*c*, and the fourth capping layer 14*c* may include the same material as the first capping layer 11*c*.

In the case where the first magnetic layer 11 includes a magnetic material including boron, another layer may be provided between the first magnetic layer 11 and the first capping layer 11*c*. The other layer includes, for example, at least one selected from the group consisting of an oxide and a nitride. For example, such a layer functions as a diffusion suppression layer. Thereby, for example, the diffusion of the boron is suppressed. By providing the diffusion suppression layer, for example, the diffusion of the boron included in the first magnetic layer 11 is suppressed. For example, the amorphous structure of the first magnetic layer 11 is maintained easily. The diffusion suppression layer includes, for example, an oxide including at least one element selected from the group consisting of Mg, Al, Si, Ti, V, Cr, Mn, Fe, Co, Ni, Cu, Zn, Zr, Nb, Mo, Ru, Rh, Pd, Ag, Hf, Ta, W, Sn, Cd, and Ga. The diffusion suppression layer includes, for example, a nitride including the at least one element recited above. The diffusion suppression layer is, for example, a layer that substantially does not contribute to the magnetoresistance effect. It is favorable for the resistance per area of the diffusion suppression layer to be low. For example, it is favorable for the resistance per area of the diffusion suppression layer to be set to be lower than the resistance per area of the intermediate layer (e.g., the first nonmagnetic layer 11*n*) contributing to the magnetoresistance effect. The diffusion suppression layer includes at least one of, for example, an oxide including at least one element selected from the group consisting of Mg, Ti, V, Zn, Sn, Cd, and Ga or a nitride including the at least one element recited above. In such a case, the resistance per area of the diffusion suppression layer is reduced easily. The barrier height is low for these materials. It is favorable for the diffusion suppression layer to include an oxide having a strong chemical bond. Thereby, for example, the diffusion of boron is easily suppressed further. The diffusion suppression layer includes, for example, a MgO layer of 1.5 nm. An oxynitride is included in one of the oxide or the nitride.

In the case where the diffusion suppression layer includes an oxide or a nitride, it is favorable for the thickness of the diffusion suppression layer to be, for example, 0.5 nm or more. The diffusion suppression function of the boron is realized sufficiently thereby. It is favorable for the thickness of the diffusion suppression layer to be 5 nm or less. Thereby, for example, a low resistance per area is obtained. It is favorable for the thickness of the diffusion suppression layer to be not less than 0.5 nm and not more than 5 nm, and more favorable to be not less than 1 nm and not more than 3 nm.

The diffusion suppression layer may include at least one selected from the group consisting of magnesium (Mg), silicon (Si), and aluminum (Al). The diffusion suppression layer includes a material including these light elements. These light elements produce compounds by bonding with boron. For example, at least one of a Mg—B compound, an Al—B compound, or a Si—B compound is formed at a portion including the interface between the diffusion suppression layer and the free magnetic layer. These compounds suppress the diffusion of boron.

Figure 10:
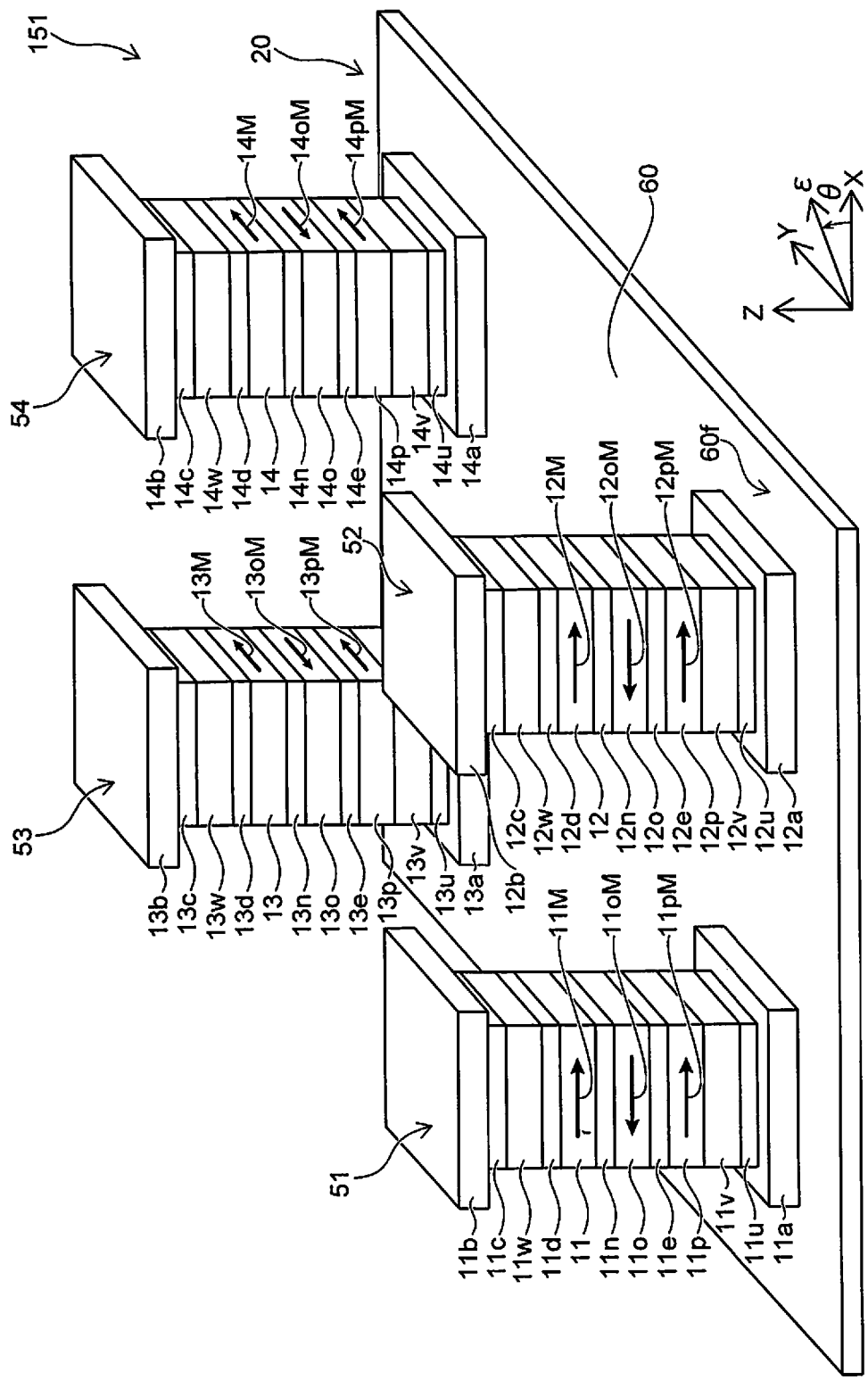
FIG. 10 is a schematic perspective view illustrating a sensor according to the embodiment.

FIG. 10 is a schematic perspective view illustrating a sensor according to the embodiment.

In the sensor 151 according to the embodiment as shown in FIG. 10, the first to fourth detecting elements 51 to 54 are provided in the detector 20.

The first detecting element 51 includes the first lower electrode 11a, the first foundation layer 11u, the first pinning layer 11v, the first pinned magnetic layer 11p, the first magnetic coupling layer 11e, the first opposing magnetic layer 11o, the first nonmagnetic layer 11n, the first magnetic layer 11, a first magnetic coupling adjusting layer 11d, a first opposing pinning layer 11w, the first capping layer 11c, and the first upper electrode 11b.

The second detecting element 52 includes the second lower electrode 12a, the second foundation layer 12u, the second pinning layer 12v, the second pinned magnetic layer 12p, the second magnetic coupling layer 12e, the second opposing magnetic layer 12o, the second nonmagnetic layer 12n, the second magnetic layer 12, a second magnetic coupling adjusting layer 12d, a second opposing pinning layer 12w, the second capping layer 12c, and the second upper electrode 12b.

The third detecting element 53 includes the third lower electrode 13a, the third foundation layer 13u, the third pinning layer 13v, the third pinned magnetic layer 13p, the third magnetic coupling layer 13e, the third opposing magnetic layer 13o, the third nonmagnetic layer 13n, the third magnetic layer 13, a third magnetic coupling adjusting layer 13d, a third opposing pinning layer 13w, the third capping layer 13c, and the third upper electrode 13b.

The fourth detecting element 54 includes the fourth lower electrode 14a, the fourth foundation layer 14u, the fourth pinning layer 14v, the fourth pinned magnetic layer 14p, the fourth magnetic coupling layer 14e, the fourth opposing magnetic layer 14o, the fourth nonmagnetic layer 14n, the fourth magnetic layer 14, a fourth magnetic coupling adjusting layer 14d, a fourth opposing pinning layer 14w, the fourth capping layer 14c, and the fourth upper electrode 14b.

The first to fourth detecting elements 51 to 54 of the sensor 151 are the first to fourth detecting elements 51 to 54 of the sensor 150 in which the first to fourth magnetic coupling adjusting layers 11d to 14d and the first to fourth opposing pinning layers 11w to 14w are further included respectively.

In the sensor 151, the first to fourth lower electrodes 11a to 14a, the first to fourth foundation layers 11u to 14u, the first to fourth pinning layers 11v to 14v, the first to fourth pinned magnetic layers 11p to 14p, the first to fourth magnetic coupling layers 11e to 14e, the first opposing magnetic layers 11o to 14o, the first to fourth nonmagnetic layers 11n to 14n, the first to fourth magnetic layers 11 to 14, the first to fourth capping layers 11c to 14c, and the first to fourth upper electrodes 11b to 14b include, for example, the materials described in reference to the sensor 150.

The first magnetic coupling adjusting layer 11d includes, for example, a nonmagnetic material. The first magnetic coupling adjusting layer 11d includes, for example, at least one element selected from the group consisting of Cu, Ru, Rh, Ir, V, Cr, Nb, Mo, Ta, W, Au, Ag, Pt, Pd, Ti, Zr, and Hf. For example, the first magnetic coupling adjusting layer 11d includes a Ru layer of 0.8 nm. The second magnetic coupling adjusting layer 12d, the third magnetic coupling adjusting layer 13d, and the fourth magnetic coupling adjusting layer 14d include the materials described in reference to the first magnetic coupling adjusting layer 11d. The second magnetic coupling adjusting layer 12d, the third magnetic coupling adjusting layer 13d, and the fourth magnetic coupling adjusting layer 14d may include the same material as the first magnetic coupling adjusting layer 11d.

For example, the first opposing pinning layer 11w provides unidirectional anisotropy to the first magnetic layer 11 (the ferromagnetic layer) formed under the first opposing pinning layer 11w with the first magnetic coupling adjusting layer 11d interposed. A magnetic bias is applied to the magnetization of the first magnetic layer 11. For example, the direction of the initial magnetization of the first magnetic layer 11 is set in one direction in the state in which strain is not applied to the sensor 151.

The first opposing pinning layer 11w includes, for example, an antiferromagnetic layer. The first opposing pinning layer 11w includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The first opposing pinning layer 11w may include an alloy including another element and at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the first opposing pinning layer 11w is set appropriately. Thereby, for example, unidirectional anisotropy that has a sufficient strength is provided.

For example, heat treatment is performed while applying a magnetic field. Thereby, for example, the magnetization of the ferromagnetic layer contacting the first opposing pinning layer 11w is fixed. The magnetization of the ferromagnetic layer contacting the first opposing pinning layer 11w is fixed in the direction of the magnetic field applied in the heat treatment. For example, the heat treatment temperature (the annealing temperature) is not less than the magnetization pinning temperature of the antiferromagnetic material included in the first opposing pinning layer 11w. In the case where the first opposing pinning layer 11w includes an antiferromagnetic layer including Mn, the MR ratio may decrease due to the Mn diffusing into layers other than the first opposing pinning layer 11w. It is desirable for the heat treatment temperature to be set to be not more than the temperature at which the diffusion of Mn occurs. The heat treatment temperature is, for example, not less than 200° C. and not more than 500° C. For example, it is favorable for the heat treatment temperature to be not less than 250° C. and not more than 400° C.

In the case where the first opposing pinning layer 11w includes at least one selected from the group consisting of PtMn and PdPtMn, it is favorable for the thickness of the first opposing pinning layer 11w to be not less than 8 nm and not more than 20 nm. It is more favorable for the thickness of the first opposing pinning layer 11w to be not less than 10 nm and not more than 15 nm. Unidirectional anisotropy can be provided by a thinner thickness when the first opposing pinning layer 11w includes IrMn than when the first opposing pinning layer 11w includes PtMn. In the case where the first opposing pinning layer 11w includes IrMn, it is favorable for the thickness of the first opposing pinning layer 11w to be not less than 4 nm and not more than 18 nm. In the case where the first opposing pinning layer 11w includes IrMn, it is more favorable for the thickness of the first opposing pinning layer 11w to be not less than 5 nm and not more than 15 nm. The first opposing pinning layer 11w includes, for example, an $Ir_{22}Mn_{78}$ layer having a thickness of 7 nm.

The first opposing pinning layer 11w may include a hard magnetic layer. The hard magnetic layer may include, for example, at least one selected from the group consisting of Co—Pt, Fe—Pt, Co—Pd, and Fe—Pd. For example, the magnetic anisotropy and the coercivity are relatively high for these materials. These materials are hard magnetic materials. The first opposing pinning layer 11w may include an alloy including another element and at least one selected from the group consisting of Co—Pt, Fe—Pt, Co—Pd, and Fe—Pd. The first opposing pinning layer 11w may include, for example, at least one selected from the group consisting of CoPt (the ratio of Co being not less than 50 at. % and not more than 85 at. %) $(Co_xPt_{100-x})_{100-y}Cr_y$, (x being not less than 50 at. % and not more than 85 at. %, and y being not less than 0 at. % and not more than 40 at. %), and FePt (the ratio of Pt being not less than 40 at. % and not more than 60 at. %).

The second opposing pinning layer 12w, the third opposing pinning layer 13w, and the fourth opposing pinning layer 14w include the materials described in reference to the first opposing pinning layer 11w. The second opposing pinning layer 12w, the third opposing pinning layer 13w, and the fourth opposing pinning layer 14w may include the same material as the first opposing pinning layer 11w.

The third opposing pinning layer 13w (and the fourth opposing pinning layer 14w) may respectively include materials that are different from the materials of the first opposing pinning layer 11w and the second opposing pinning layer 12w. For example, the third opposing pinning layer 13w (and the fourth opposing pinning layer 14w) may include Pt—Mn alloys; and the first opposing pinning layer 11w (and the second opposing pinning layer 12w) may include Ir—Mn alloys. Thus, by using different materials, for example, the initial magnetization 13M of the third magnetic layer 13 (and the initial magnetization 14M of the fourth magnetic layer 14) can easily cross the initial magnetization 11M of the first magnetic layer 11 (and the initial magnetization 12M of the second magnetic layer 12) (referring to FIG. 10).

Figure 11:
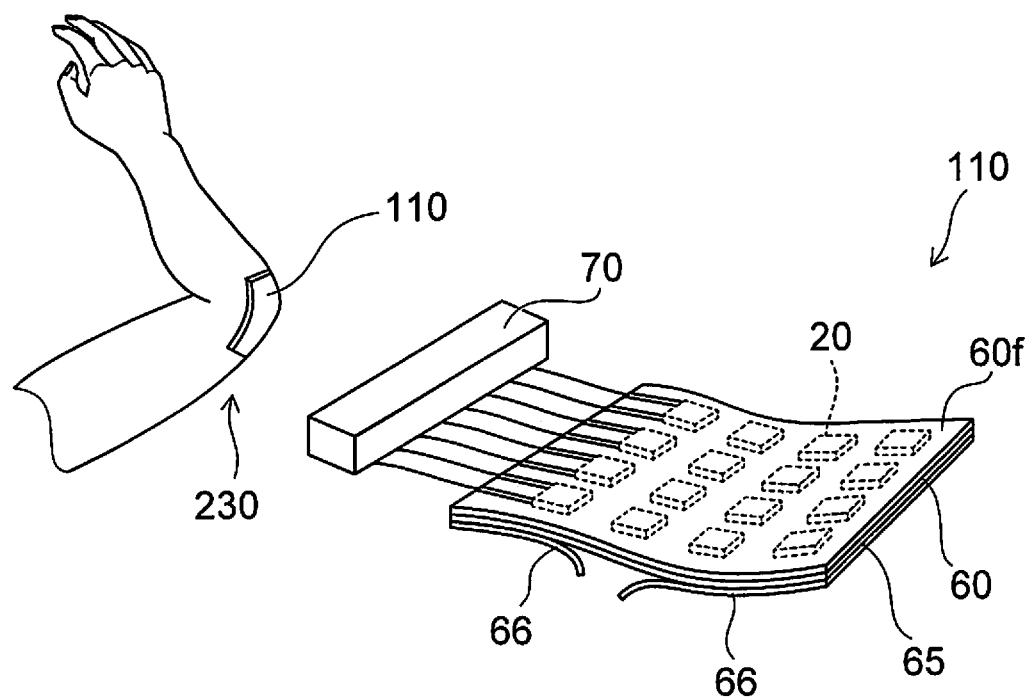
FIG. 11 is a schematic perspective view illustrating the sensor according to the embodiment.

FIG. 11 is a schematic perspective view illustrating the sensor according to the embodiment.

As shown in FIG. 11, the sensor (e.g., the sensor 110 or the like) according to the embodiment may be provided at a movable portion 230, etc. In the example, the movable portion 230 is a human joint, etc. For example, strain is generated in the film portion 60 according to the rotation of the movable portion 230. The movement of the movable portion 230 can be detected by the sensor 110 detecting the strain. The movable portion 230 may be a portion of a machine.

As shown in FIG. 11, the sensor (e.g., the sensor 110) according to the embodiment may include an adhesive layer 65. The adhesive layer 65 is provided for at least a portion of the film portion 60. The film portion 60 may be fixed to the movable portion 230 by the adhesive layer 65.

As shown in FIG. 11, the sensor 110 may further include a release sheet 66. For example, the adhesive layer 65 is provided between the release sheet 66 and at least a portion of the film portion 60 recited above. For example, the release sheet 66 is peelable from the adhesive layer 65.

The embodiments include, for example, the following configurations (e.g., technological proposals).

Configuration 1

A sensor, comprising:
a film portion;
one or more detectors fixed to the film portion; and
a processor,
a magnitude of a strain of the film portion including a first range, and a second range larger than the first range,
the detector including a first detecting element and a second detecting element, the first detecting element including a first magnetic layer, the second detecting element including a second magnetic layer,
a first change rate of a first signal being higher than a second change rate of the first signal, the first signal corresponding to a first electrical resistance of the first detecting element, the first change rate being a change rate of the first signal with respect to a change of the magnitude of the strain within the first range, the second change rate being a change rate of the first signal with respect to a change of the magnitude of the strain within the second range, a change rate of a second signal with respect to the change of the magnitude of the strain within the second range being higher than the second change rate, the second signal corresponding to a second electrical resistance of the second detecting element, the processor being configured to perform at least a first operation of outputting a second value, the second value being based on the second signal and a first value, the first value being based on the first signal when a first strain is generated in the film portion, the second signal being when the first strain is generated in the film portion.

Configuration 2

The sensor according to Configuration 1, wherein a magnitude of the first strain is within the second range.

Configuration 3

The sensor according to Configuration 2, wherein
the first value includes information relating to a direction of the first strain, and
the second value includes information relating to the magnitude of the first strain.

Configuration 4

The sensor according to any one of Configurations 1 to 3, wherein a change rate of the second signal of the second detecting element with respect to the change of the strain within the first range is lower than the first change rate.

Configuration 5

The sensor according to any one of Configurations 1 to 4, wherein the first change rate is 5 times the second change rate or more.

Configuration 6

The sensor according to any one of Configurations 1 to 5, wherein the first detecting element further includes a first opposing magnetic layer, and a first nonmagnetic layer provided between the first magnetic layer and the first opposing magnetic layer,
the second detecting element further includes a second opposing magnetic layer, and a second nonmagnetic layer provided between the second magnetic layer and the second opposing magnetic layer, and
a magnetization of the first opposing magnetic layer is aligned with a magnetization of the second opposing magnetic layer.

Configuration 7

The sensor according to Configuration 6, wherein
the film portion has a first surface,
one of the first magnetic layer or the first opposing magnetic layer is provided between the first surface and the other of the first magnetic layer or the first opposing magnetic layer, and
one of the second magnetic layer or the second opposing magnetic layer is provided between the first surface and the other of the second magnetic layer or the second opposing magnetic layer.

Configuration 8

The sensor according to Configuration 6 or 7, wherein
the detector further includes a third detecting element and a fourth detecting element,
the third detecting element includes a third magnetic layer, a third opposing magnetic layer, and a third nonmagnetic layer provided between the third magnetic layer and the third opposing magnetic layer,
the fourth detecting element includes a fourth magnetic layer, a fourth opposing magnetic layer, and a fourth nonmagnetic layer provided between the fourth magnetic layer and the fourth opposing magnetic layer, a magnetization of the third opposing magnetic layer is aligned with a magnetization of the fourth opposing magnetic layer, and the magnetization of the third opposing magnetic layer crosses the magnetization of the first opposing magnetic layer.

Configuration 9

The sensor according to Configuration 8, wherein a third change rate of a third signal corresponding to a third electrical resistance of the third detecting element is higher than a fourth change rate of the third signal, the third change rate being a change rate of the third signal with respect to the change of the strain within the first range, the fourth change rate being a change rate of the third signal with respect to the change of the strain within the second range, a change rate of a fourth signal with respect to the change of the strain within the second range is higher than the fourth change rate, the fourth signal corresponding to a fourth electrical resistance of the fourth detecting element, and the processor is configured to further perform at least a second operation of outputting a fourth value based on the fourth signal and a third value, the third value being based on the third signal when the first strain is generated in the film portion, the fourth signal being when the first strain is generated in the film portion.

Configuration 10

The sensor according to Configuration 9, wherein the third value includes information relating to a direction of the first strain, and the fourth value includes information relating to a magnitude of the first strain.

Configuration 11

The sensor according to Configuration 9 or 10, wherein a change rate of a signal with respect to the change of the strain of the first range is lower than the third change rate, the signal corresponding to the fourth electrical resistance of the fourth detecting element.

Configuration 12

The sensor according to any one of Configurations 8 to 11, wherein an angle between the magnetization of the third opposing magnetic layer and the magnetization of the first opposing magnetic layer is not less than 45 degrees and not more than 135 degrees.

Configuration 13

A sensor, comprising:

a film portion; and one or more detectors fixed to the film portion, the detector including first to fourth detecting elements, the first detecting element including a first magnetic layer, a first opposing magnetic layer, and a first nonmagnetic layer provided between the first magnetic layer and the first opposing magnetic layer, the second detecting element including a second magnetic layer, a second opposing magnetic layer, and a second nonmagnetic layer provided between the second magnetic layer and the second opposing magnetic layer, the third detecting element including a third magnetic layer, a third opposing magnetic layer, and a third nonmagnetic layer provided between the third magnetic layer and the third opposing magnetic layer, the fourth detecting element including a fourth magnetic layer, a fourth opposing magnetic layer, and a fourth nonmagnetic layer provided between the fourth magnetic layer and the fourth opposing magnetic layer, a magnetization of the first opposing magnetic layer being aligned with a magnetization of the second opposing magnetic layer, a magnetization of the third opposing magnetic layer being aligned with a magnetization of the fourth opposing magnetic layer, the magnetization of the third opposing magnetic layer crossing the magnetization of the first opposing magnetic layer, a magnitude of a strain of the film portion including a first range, and a second range larger than the first range, a first change rate of a first signal being higher than a second change rate of the first signal, the first signal corresponding to a first electrical resistance of the first detecting element, the first change rate being a change rate of the first signal with respect to a change of the magnitude of the strain within the first range, the second change rate being a change rate of the first signal with respect to a change of the magnitude of the strain within the second range, a change rate of a second signal with respect to the change of the magnitude of the strain within the second range being higher than the second change rate, the second signal corresponding to a second electrical resistance of the second detecting element, a third change rate of a third signal being higher than a fourth change rate of the third signal, the third signal corresponding to a third electrical resistance of the third detecting element, the third change rate being a change rate of the third signal with respect to the change of the strain within the first range, the fourth change rate being a change rate of the third signal with respect to the change of the strain within the second range, a change rate of a fourth signal with respect to the change of the strain within the second range being higher than the fourth change rate, the fourth signal corresponding to a fourth electrical resistance of the fourth detecting element.

Configuration 14

The sensor according to Configuration 13, wherein the film portion has a first surface, one of the first magnetic layer or the first opposing magnetic layer is provided between the first surface and the other of the first magnetic layer or the first opposing magnetic layer, one of the second magnetic layer or the second opposing magnetic layer is provided between the first surface and the other of the second magnetic layer or the second opposing magnetic layer, one of the third magnetic layer or the third opposing magnetic layer is provided between the first surface and the other of the third magnetic layer or the third opposing magnetic layer, one of the fourth magnetic layer or the fourth opposing magnetic layer is provided between the first surface and the other of the fourth magnetic layer or the fourth opposing magnetic layer, a first length of the first magnetic layer along a first direction is longer than a first cross-direction length of the first magnetic layer along a second direction crossing the first direction, the first direction and the second direction being along the first surface, a second length of the second magnetic layer along the first direction is longer than a second cross-direction length of the second magnetic layer along the second direction, a third length of the third magnetic layer along a third direction is longer than a third cross-direction length of the third magnetic layer along a fourth direction crossing the third direction, the third direction and the fourth direction being along the first surface, and a fourth length of the fourth magnetic layer along the third direction is longer than a fourth cross-direction length of the fourth magnetic layer along the fourth direction.

Configuration 15

The sensor according to Configuration 14, wherein
the third direction crosses the first direction, and
the fourth direction crosses the second direction.

Configuration 16

The sensor according to Configuration 14 or 15, wherein
a ratio of the first length to the first cross-direction length is lower than a ratio of the second length to the second cross-direction length, and a ratio of the third length to the third cross-direction length is lower than a ratio of the fourth length to the fourth cross-direction length.

Configuration 17

The sensor according to any one of Configurations 13 to 16, wherein
the first to fourth magnetic layers include FeB, and
the first to fourth opposing magnetic layers include NiFe.

Configuration 18

The sensor according to any one of Configurations 1 to 17, wherein
the detector includes a plurality of the first detecting elements,
at least two of the plurality of first detecting elements are connected in series, and
the first electrical resistance includes electrical resistances of the plurality of first detecting elements.

Configuration 19

The sensor according to any one of Configurations 1 to 18, further comprising an adhesive layer provided for at least a portion of the film portion.

Configuration 20

The sensor according to Configuration 19, further comprising a release sheet,
the adhesive layer being provided between the release sheet and the at least a portion of the film portion,
the release sheet being peelable from the adhesive layer.

According to the embodiments, a sensor that has higher sensitivity can be provided.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as film portions, detectors, detecting elements, magnetic layers, nonmagnetic layers, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a film portion;
one or more detectors fixed to the film portion; and
a processor,
a magnitude of a strain of the film portion including a first range, and a second range larger than the first range,
the detector including a first detecting element and a second detecting element, the first detecting element including a first magnetic layer, the second detecting element including a second magnetic layer,
a first change rate of a first signal being higher than a second change rate of the first signal, the first signal corresponding to a first electrical resistance of the first detecting element, the first change rate being a change rate of the first signal with respect to a change of the magnitude of the strain within the first range, the second change rate being a change rate of the first signal with respect to a change of the magnitude of the strain within the second range,
a change rate of a second signal with respect to the change of the magnitude of the strain within the second range being higher than the second change rate, the second signal corresponding to a second electrical resistance of the second detecting element,
the processor being configured to perform at least a first operation of outputting a second value, the second value being based on the second signal and a first value, the first value being based on the first signal when a first strain is generated in the film portion, the second signal being when the first strain is generated in the film portion.

2. The sensor according to claim 1, wherein a magnitude of the first strain is within the second range.

3. The sensor according to claim 2, wherein
the first value includes information relating to a direction of the first strain, and
the second value includes information relating to the magnitude of the first strain.

4. The sensor according to claim 1, wherein a change rate of the second signal of the second detecting element with respect to the change of the strain within the first range is lower than the first change rate.

5. The sensor according to claim 1, wherein the first change rate is 5 times the second change rate or more.

6. The sensor according to claim 1, wherein the first detecting element further includes a first opposing magnetic layer, and a first nonmagnetic layer provided between the first magnetic layer and the first opposing magnetic layer,
the second detecting element further includes a second opposing magnetic layer, and a second nonmagnetic layer provided between the second magnetic layer and the second opposing magnetic layer, and
a magnetization of the first opposing magnetic layer is aligned with a magnetization of the second opposing magnetic layer.

7. The sensor according to claim 6, wherein
the film portion has a first surface,
one of the first magnetic layer or the first opposing magnetic layer is provided between the first surface and the other of the first magnetic layer or the first opposing magnetic layer, and
one of the second magnetic layer or the second opposing magnetic layer is provided between the first surface and the other of the second magnetic layer or the second opposing magnetic layer.

8. The sensor according to claim 6, wherein
the detector further includes a third detecting element and a fourth detecting element,
the third detecting element includes a third magnetic layer, a third opposing magnetic layer, and a third nonmagnetic layer provided between the third magnetic layer and the third opposing magnetic layer,
the fourth detecting element includes a fourth magnetic layer, a fourth opposing magnetic layer, and a fourth nonmagnetic layer provided between the fourth magnetic layer and the fourth opposing magnetic layer,
a magnetization of the third opposing magnetic layer is aligned with a magnetization of the fourth opposing magnetic layer, and
the magnetization of the third opposing magnetic layer crosses the magnetization of the first opposing magnetic layer.

9. The sensor according to claim 8, wherein
a third change rate of a third signal corresponding to a third electrical resistance of the third detecting element is higher than a fourth change rate of the third signal, the third change rate being a change rate of the third signal with respect to the change of the strain within the first range, the fourth change rate being a change rate of the third signal with respect to the change of the strain within the second range,
a change rate of a fourth signal with respect to the change of the strain within the second range is higher than the fourth change rate, the fourth signal corresponding to a fourth electrical resistance of the fourth detecting element, and
the processor is configured to further perform at least a second operation of outputting a fourth value based on the fourth signal and a third value, the third value being based on the third signal when the first strain is generated in the film portion, the fourth signal being when the first strain is generated in the film portion.

10. The sensor according to claim 9, wherein
the third value includes information relating to a direction of the first strain, and
the fourth value includes information relating to a magnitude of the first strain.

11. The sensor according to claim 9, wherein a change rate of a signal with respect to the change of the strain of the first range is lower than the third change rate, the signal corresponding to the fourth electrical resistance of the fourth detecting element.

12. The sensor according to claim 8, wherein an angle between the magnetization of the third opposing magnetic layer and the magnetization of the first opposing magnetic layer is not less than 45 degrees and not more than 135 degrees.

13. The sensor according to claim 1, wherein
the detector includes a plurality of the first detecting elements,
at least two of the plurality of first detecting elements are connected in series, and
the first electrical resistance includes electrical resistances of the plurality of first detecting elements.

14. The sensor according to claim 1, further comprising an adhesive layer provided for at least a portion of the film portion.

15. The sensor according to claim 14, further comprising a release sheet,
the adhesive, layer being provided between the release sheet and the at least a portion of the film portion,
the release sheet being peelable from the adhesive layer.

16. A sensor, comprising:
a film portion; and
one or more detectors fixed to the film portion,
the detector including first to fourth detecting elements,
the first detecting element including a first magnetic layer, a first opposing magnetic layer, and a first nonmagnetic layer provided between the first magnetic layer and the first opposing magnetic layer,
the second detecting element including a second magnetic layer, a second opposing magnetic layer, and a second nonmagnetic layer provided between the second magnetic layer and the second opposing magnetic layer,
the third detecting element including a third magnetic layer, a third opposing magnetic layer, and a third nonmagnetic layer provided between the third magnetic layer and the third opposing magnetic layer,
the fourth detecting element including a fourth magnetic layer, a fourth opposing magnetic layer, and a fourth nonmagnetic layer provided between the fourth magnetic layer and the fourth opposing magnetic layer,
a magnetization of the first opposing magnetic layer being aligned with a magnetization of the second opposing magnetic layer,
a magnetization of the third opposing magnetic layer being aligned with a magnetization of the fourth opposing magnetic layer,
the magnetization of the third opposing magnetic layer crossing the magnetization of the first opposing magnetic layer,
a magnitude of a strain of the film portion including a first range, and a second range larger than the first range,
a first change rate of a first signal being higher than a second change rate of the first signal, the first signal corresponding to a first electrical resistance of the first detecting element, the first change rate being a change rate of the first signal with respect to a change of the magnitude of the strain within the first range, the second change rate being a change rate of the first signal with respect to a change of the magnitude of the strain within the second range,
a change rate of a second signal with respect to the change of the magnitude of the strain within the second range being higher than the second change rate, the second signal corresponding to a second electrical resistance of the second detecting element, a third change rate of a third signal being higher than a fourth change rate of the third signal, the third signal corresponding to a third electrical resistance of the third detecting element, the third change rate being a change rate of the third signal with respect to the change of the strain within the first range, the fourth change rate being a change rate of the third signal with respect to the change of the strain within the second range, a change rate of a fourth signal with respect to the change of the strain within the second range being higher than the fourth change rate, the fourth signal corresponding to a fourth electrical resistance of the fourth detecting element.

17. The sensor according to claim 16, wherein
the film portion has a first surface,
one of the first magnetic layer or the first opposing magnetic layer is provided between the first surface and the other of the first magnetic layer or the first opposing magnetic layer,
one of the second magnetic layer or the second opposing magnetic layer is provided between the first surface and the other of the second magnetic layer or the second opposing magnetic layer,
one of the third magnetic layer or the third opposing magnetic layer is provided between the first surface and the other of the third magnetic layer or the third opposing magnetic layer,
one of the fourth magnetic layer or the fourth opposing magnetic layer is provided between the first surface and the other of the fourth magnetic layer or the fourth opposing magnetic layer, a first length of the first magnetic layer along a first direction is longer than a first cross-direction length of the first magnetic layer along a second direction crossing the first direction, the first direction and the second direction being along the first surface, a second length of the second magnetic layer along the first direction is longer than a second cross-direction length of the second magnetic layer along the second direction, a third length of the third magnetic layer along a third direction is longer than a third cross-direction length of the third magnetic layer along a fourth direction crossing the third direction, the third direction and the fourth direction being along the first surface, and a fourth length of the fourth magnetic layer along the third direction is longer than a fourth cross-direction length of the fourth magnetic layer along the fourth direction.

18. The sensor according to claim 17, wherein
the third direction crosses the first direction, and
the fourth direction crosses the second direction.

19. The sensor according to claim 17, wherein
a ratio of the first length to the first cross-direction length is lower than a ratio of the second length to the second cross-direction length, and
a ratio of the third length to the third cross-direction length is lower than a ratio of the fourth length to the fourth cross-direction length.

20. The sensor according to claim 16, wherein
the first to fourth magnetic layers include FeB, and
the first to fourth opposing magnetic layers include NiFe.

* * * * *

UNITED STATES PATENT AND TRADEMARK OFFICE
CERTIFICATE OF CORRECTION

PATENT NO. : 10,883,815 B2
APPLICATION NO. : 16/281192
DATED : January 5, 2021
INVENTOR(S) : Yoshihiko Fuji et al.

Page 1 of 1

It is certified that error appears in the above-identified patent and that said Letters Patent is hereby corrected as shown below:

In the Claims

Claim 15, Column 32, Line 23, "the adhesive, layer" should read --the adhesive layer--.

Signed and Sealed this
Eleventh Day of May, 2021

Drew Hirshfeld
*Performing the Functions and Duties of the
Under Secretary of Commerce for Intellectual Property and
Director of the United States Patent and Trademark Office*